(12) United States Patent
Dasnurkar

(10) Patent No.: US 8,283,933 B2
(45) Date of Patent: Oct. 9, 2012

(54) SYSTEMS AND METHODS FOR BUILT IN SELF TEST JITTER MEASUREMENT

(75) Inventor: Sachin D Dasnurkar, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 430 days.

(21) Appl. No.: 12/707,534

(22) Filed: Feb. 17, 2010

(65) Prior Publication Data

US 2010/0231233 A1 Sep. 16, 2010

Related U.S. Application Data

(60) Provisional application No. 61/160,192, filed on Mar. 13, 2009.

(51) Int. Cl.
*G01R 29/26* (2006.01)
(52) U.S. Cl. ........ 324/613; 324/555; 375/354; 327/141; 327/147; 702/69
(58) Field of Classification Search .................. 324/613; 702/69
See application file for complete search history.

(56) References Cited

U.S. PATENT DOCUMENTS

| | | | |
|---|---|---|---|
| 6,670,800 B2 * | 12/2003 | Beach et al. | 324/76.16 |
| 7,912,166 B2 * | 3/2011 | Hsu et al. | 375/354 |
| 2003/0210028 A1 * | 11/2003 | Beach et al. | 324/76.16 |
| 2006/0038598 A1 * | 2/2006 | Reilly et al. | 327/261 |
| 2007/0296440 A1 * | 12/2007 | Takamiya et al. | 324/763 |
| 2008/0125990 A1 * | 5/2008 | Chang | 702/69 |
| 2010/0026314 A1 * | 2/2010 | Schuttert | 324/555 |
| 2010/0194445 A1 * | 8/2010 | Balakrishnan et al. | 327/108 |
| 2011/0137604 A1 * | 6/2011 | Dasnurkar | 702/117 |

OTHER PUBLICATIONS

Azais F, et al., "A Low-Cost Adaptive Ramp Generator for Analog BIST Applications", VLSI Test Symposium, 19th IEEE Proceedings on, VTS 2001 Apr. 29-May 3, 2001, Piscataway, NJ, USA,IEEE, Apr. 29, 2001, pp. 266-271, XP010542397.
Dalal W., et al., "Measuring Jitter of High Speed Data Channels Using Undersampling Techniques", IEEE International Test Conference, Paper 32.3, pp. 814-818, 2003.
Erdem S Erdogan, et al., "An ADC-BiST Scheme Using Sequential Code Analysis" Design, Automation&Test in Europe Conference &Exhibition, 2007. Date '07, IEEE, PI, Apr. 1, 2007, pp. 1-6, XP031092194 ISBN: 978-3-9810801-2-4 the whole document.
Ichiyama K., et al., "Data Jitter Measurement Using a Delta-Time-to-Voltage Converter Method", International Test Conference, Paper 4.1, 2007, 7 pages.

(Continued)

*Primary Examiner* — Timothy J Dole
*Assistant Examiner* — Benjamin M Baldridge
(74) *Attorney, Agent, or Firm* — William M. Hooks

(57) ABSTRACT

An apparatus configured for built in self test (BIST) jitter measurement is described. The apparatus includes a time-to-voltage converter. The time-to-voltage converter generates a voltage signal proportional to timing jitter present in a clock/data signal input. The apparatus also includes feedback circuitry for the time-to-voltage converter. The feedback circuitry provides a ramp slope for the time-to-voltage converter. The apparatus further includes a calibration controller. The calibration controller provides control signals to the time-to-voltage converter for process-independent calibration. The apparatus also includes a sample-and-hold (S/H) circuit. The S/H circuit provides a set bias voltage to the time-to-voltage converter once calibration is complete.

29 Claims, 18 Drawing Sheets

OTHER PUBLICATIONS

Ishida M., et al., "A Programmable On-Chip Picosecond Jitter-Measurement Circuit without a Reference-Clock Input", IEEE International Solid-State Circuits Conference, Paper 28.2, pp. 512-513, 614, 2005.

Lee, D.C, "Analysis of Jitter in Phase Locked Loops", IEEE International Symposium on Circuits and Systems, pp. 704-711, vol. 49, issue 11, 2002.

Nelson B., et al., "On-Chip Calibration Technique for Delay Line Based BIST Jitter Measurement", ISCAS, pp. 944-947, 2004.

Ong C., et al., "A Scalable On-Chip Jitter Extraction Technique", IEEE VLSI Test Symposium, vol. 22, 2004.

Tabatabaei S. et al., "Jitter Spectrum Analysis Using Continuous Time Interval Analyzer (CTIA)", IEEE International Test Conference, Austin TX Nov. 8-10, 2005, 10 pages.

Takyamiya M., et al., "On-Chip Jitter-Spectrum-Analyzer for High-Speed Digital Designs", IEEE International Solid-State Circuits Conference, Paper 19.5, 2004.

Tsai C., et al., "An On-Chip Jitter Measurement Circuit for the PLL", Asican Test Symposium, vol. 12, 2003, 10 pages.

Weigandt, Todd C., et al., "Analysis of Timing Jitter in CMOS Ring Oscillators" 1994 IEEE International Symposium on Circuits and Systems, 1994. ISCAS '94. vol. 4, Publication Year: 1994, pp. 27-30 vol. 4.

Xia T., et al., "Time-to-Voltage Converter for On-Chip Jitter Measurement", IEEE Transactions on Instrumentation and Measurement, vol. 52, No. 6, pp. 1738-1748, 2003.

* cited by examiner

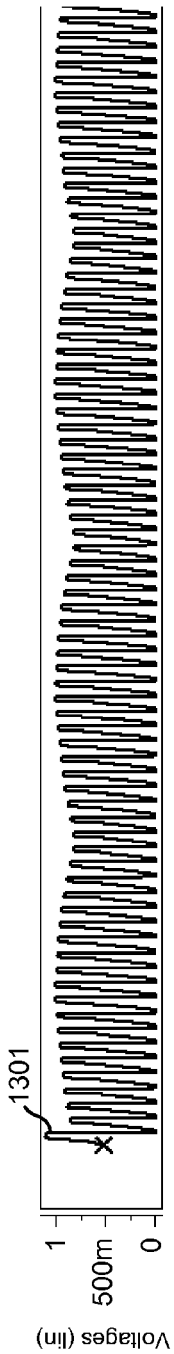
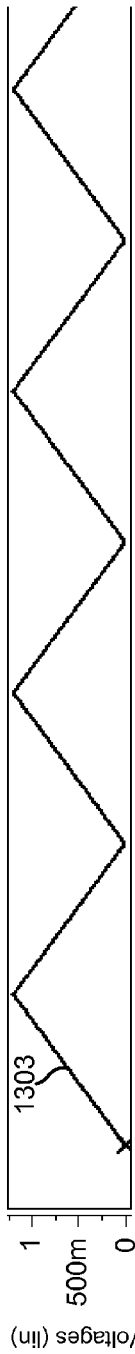
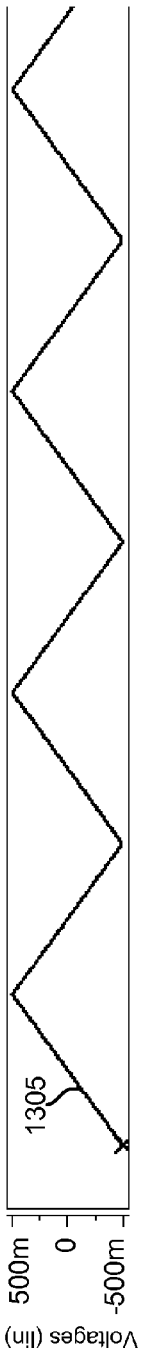
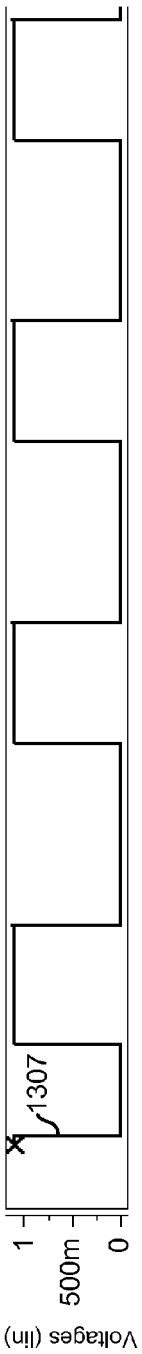
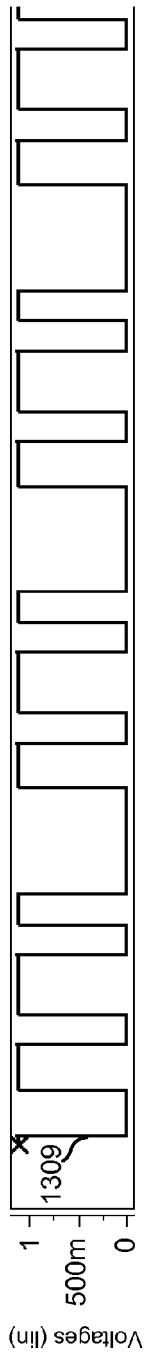
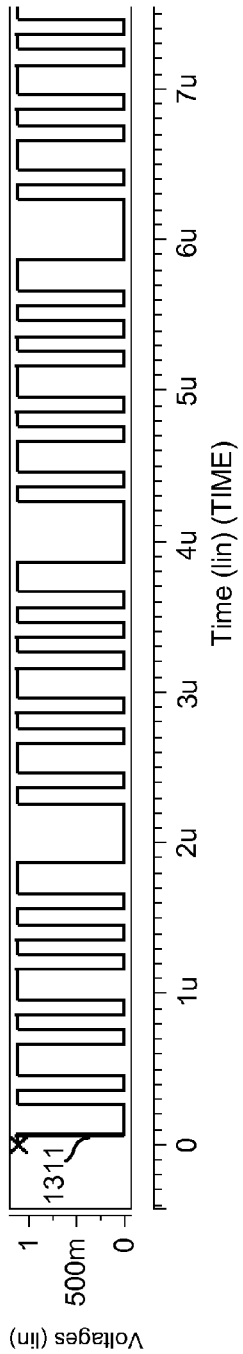
FIG. 13a
FIG. 13b
FIG. 13c
FIG. 13d
FIG. 13e
FIG. 13f

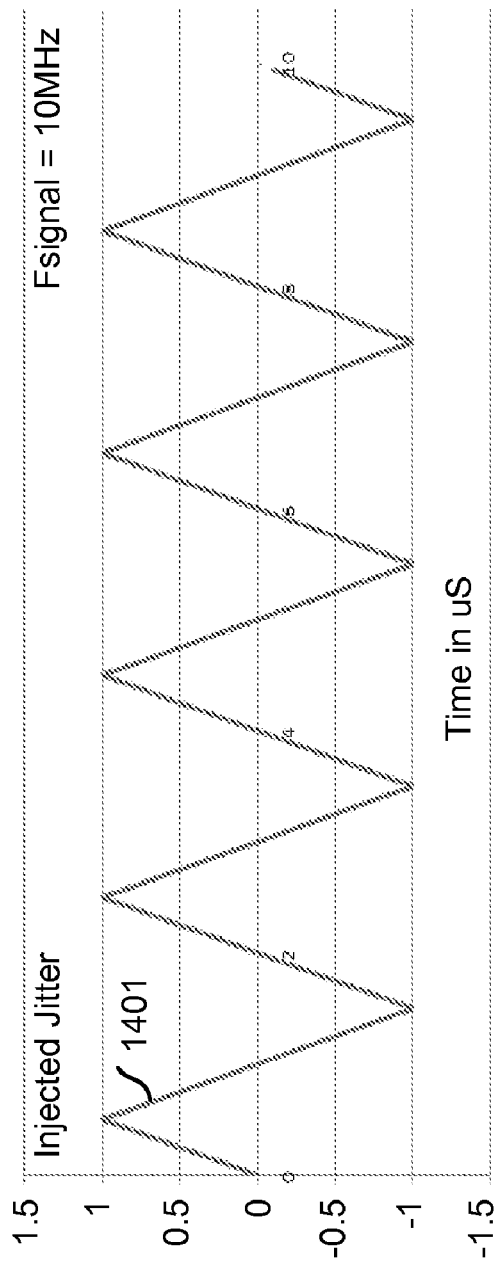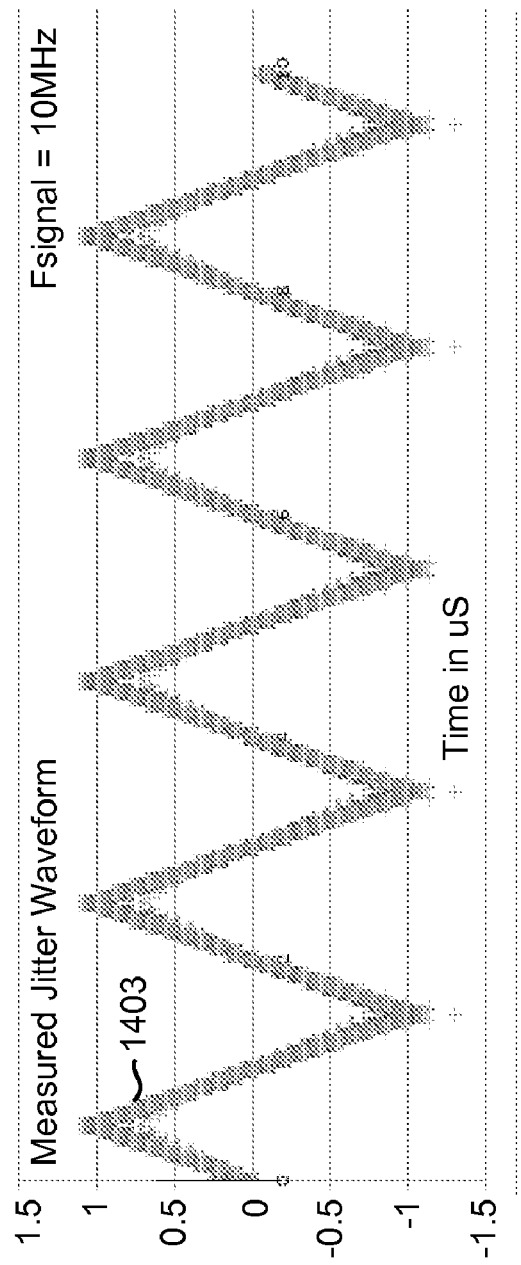

SYSTEMS AND METHODS FOR BUILT IN SELF TEST JITTER MEASUREMENT

RELATED APPLICATIONS

This application is related to and claims priority from U.S. Provisional Patent Application Ser. No. 61/160,192 filed Mar. 13, 2009, for "Systems and Methods for Built In Self Test Jitter Measurement," with inventors Sachin D. Dasnurkar and Jacob A Abraham.

TECHNICAL FIELD

The present disclosure relates generally to electronic devices for communication systems. More specifically, the present disclosure relates to systems and methods for built in self test jitter measurement.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

This increased complexity has led to an increased need for testing that can test digital circuits and/or digital systems. Testing may be used to verify or test various parts of devices, such as pieces of hardware, software or a combination of both.

In many cases the equipment used to test a device is a separate piece of equipment than the device being tested. Some testing that takes place is performed substantially by the test equipment. Benefits may be realized by providing improved methods and apparatus for providing built in self tests for electronic devices and/or components used in electronic devices.

BRIEF DESCRIPTION OF THE DRAWINGS

FIGS. 13a-13f are graphs illustrating the analog and digital waveforms of a time-to-voltage converter over time;

FIGS. 14a-14b are graphs illustrating injected jitter and output jitter; and

DETAILED DESCRIPTION

Figure 1:
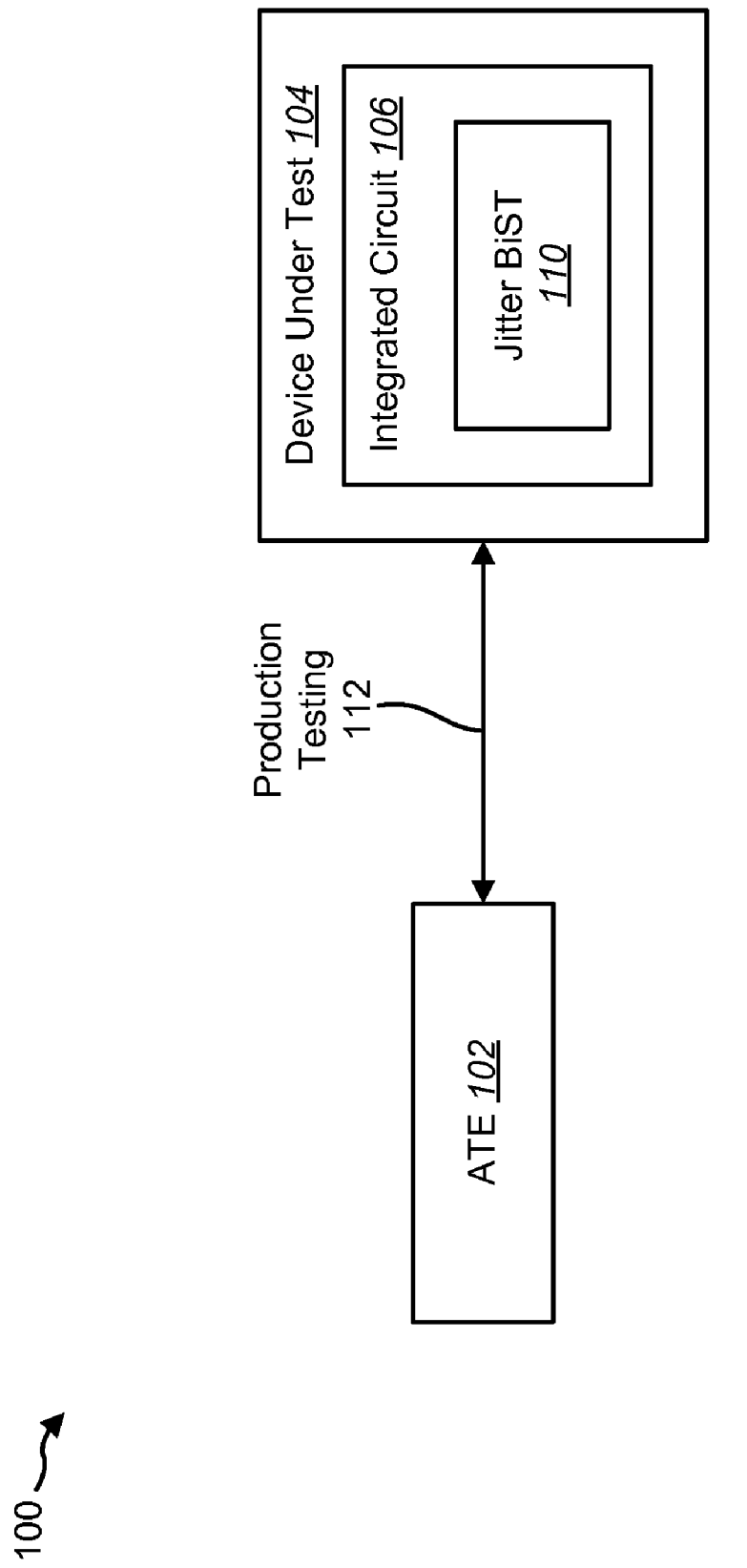
FIG. 1 shows a system for production testing of a device under test (DUT) 104 with mixed signal circuitry.

An integrated circuit configured for built in self test (BiST) jitter measurement is described. The integrated circuit includes a time-to-voltage converter that generates a voltage signal proportional to timing jitter present in a clock/data signal input. The integrated circuit also includes feedback circuitry for the time-to-voltage converter that provides a ramp slope for the time-to-voltage converter. The integrated circuit further includes a calibration controller that provides control signals to the time-to-voltage converter for process-independent calibration. The integrated circuit also includes a sample-and-hold (S/H) circuit that provides a set bias voltage to the time-to-voltage converter once calibration is complete.

The feedback circuitry may adjust a gate bias for a transistor in the time-to-voltage converter to provide a linearly increasing voltage ramp. The integrated circuit may include an on-chip analog-to-digital converter (ADC). Outputs from the ADC may be provided to output pads for observation by automatic test equipment (ATE) using a simple functional pattern. The time-to-voltage converter may include a current source applied to a capacitor. The feedback circuitry may include a clocked comparator.

The clocked comparator may output a supply voltage if the voltage ramp is less half the supply voltage at half the ramp period. The clocked comparator may outputs a voltage of zero volts if the voltage ramp is greater than half the supply voltage at half the ramp period. The integrated circuit may include a multiplexer that may switch an input for the time-to-voltage converter between the feedback circuitry and the S/H circuit.

A method for built in self test (BiST) jitter measurement is also described. A constant current is generated. A jitter voltage signal is provided by a time-to-voltage converter. The jitter voltage signal is a voltage representation of jitter in a clock/data signal input. Feedback is provided to the time-to-voltage converter. The jitter voltage signal is provided to automatic testing equipment (ATE). Jitter measurements are performed using the ATE.

Feedback circuitry may provide calibration of the time-to-voltage converter. The feedback circuitry may adjust a gate bias for a transistor in the time-to-voltage converter to provide a linearly increasing voltage ramp. The time-to-voltage generator may include a current source applied to a capacitor. The jitter voltage signal may be applied to an on-chip analog-to-digital converter (ADC). Outputs from the ADC may be provided to output pads for observation by digital ATE using a simple functional pattern. The feedback circuitry may include a clocked comparator.

The clocked comparator may output a supply voltage if the voltage ramp is less then half the supply voltage at half the ramp period. The clocked comparator may output a voltage of zero volts if the voltage ramp is greater than half the supply voltage at half the ramp period. An input for the time-to-voltage converter may be switched between the feedback circuitry and a sample-and-hold (S/H) circuit. The ADC, the time-to-voltage converter and feedback circuitry providing feedback may be capable of using phase-shifted limited duty cycle clocks. The ATE may be an analog ATE.

A wireless device configured for built in self test (BiST) jitter measurement is described. The wireless device includes a processor, memory in electronic communication with the processor, a transceiver and circuitry. The circuitry includes a time-to-voltage converter that generates a voltage signal proportional to timing jitter present in a clock/data signal input. The circuitry also includes feedback circuitry for the time-to-voltage converter that provides a ramp slope for the time-to-voltage converter. The circuitry further includes a calibration controller that provides control signals to the time-to-voltage converter for process-independent calibration. The circuitry also includes a sample-and-hold (S/H) circuit that provides a set bias voltage to the time-to-voltage converter once calibration is complete.

An apparatus for built in self test (BiST) jitter measurement is also described. The apparatus includes means for generating a constant current. The apparatus also includes means for providing a jitter voltage signal by a time-to-voltage converter. The jitter voltage signal is a voltage representation of jitter in a clock/data signal input. The apparatus further includes means for providing feedback to the time-to-voltage converter. The apparatus also includes means for providing the jitter voltage signal to automatic testing equipment (ATE). The apparatus further includes means for performing jitter measurements using the ATE.

A computer-program product for a wireless device configured for built in self test (BiST) jitter measurement is described. The computer-program product includes a computer-readable medium having instructions thereon. The instructions include code for generating a constant current. The instructions also include code for providing a jitter voltage signal by a time-to-voltage converter. The jitter voltage signal is a voltage representation of jitter in a clock/data signal input. The instructions further include code for providing feedback to the time-to-voltage converter. The instructions also include code for providing the jitter voltage signal to automatic testing equipment (ATE). The instructions further include code for performing jitter measurements using the ATE.

Many different kinds of electronic devices may benefit from testing. Different kinds of such devices include, but are not limited to, cellular telephones, wireless modems, computers, digital music players, Global Positioning System units, Personal Digital Assistants, gaming devices, etc. One group of devices includes those that may be used with wireless communication systems. As used herein, the term "mobile station" refers to an electronic device that may be used for voice and/or data communication over a wireless communication network. Examples of mobile stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc.

A wireless communication network may provide communication for a number of mobile stations, each of which may be serviced by a base station. A base station may alternatively be referred to as an access point, a Node B, or some other terminology. Base stations and mobile stations may make use of integrated circuits with mixed signal circuitry. However, many different kinds of electronic devices, in addition to the wireless devices mentioned, may make use of integrated circuits with mixed signal circuitry. Production of integrated circuits may result in process variations that affect the operation of the mixed signal circuitry. Accordingly, a broad array of electronic devices may benefit from the systems and methods disclosed herein.

Signal jitter may be present in multiple forms and may be due to various sources. Timing jitter, which corresponds to edge timing uncertainty, is of particular concern as it may cause soft errors in communication systems. Jitter in clock signals may affect any critical timing edges and resulting errors may be propagated through the circuit. Jitter in data signals may reduce the detection opening in signal eye-diagrams, making detection more prone to soft errors in receiver circuits. For video subcircuits, a subcarrier frequency shift may result in incorrect color information being transmitted.

Jitter may be classified as deterministic and random. The deterministic jitter may be predictable because the sources are known and characterized. A voltage supply drop due to supply current may change the conduction cycle of a circuit, effectively adding a duty cycle variation which is the added timing jitter. This duty cycle variation component may be predictable and hence deterministic. Various other factors such as process non-uniformity, specific data patterns, etc. may contribute to this kind of jitter. Random jitter may be caused due to non-deterministic phenomena and can be characterized statistically. Random jitter may be modeled as a single or multimode Gaussian distribution, independent of any other deterministic factors. Random jitter may be unbounded for a large number of sample points.

Production testing of semiconductor devices typically involves the optimization of maintaining test quality to ensure a low defect rate in the final product while minimizing the overall test cost. Various matrices may be defined for test quality and the corresponding defect rates, which need to be adhered to with the available resources. Low cost testers have been developed in order to reduce test costs by downgrading Automatic Test Equipment (ATE) hardware resources. Providing voltage and timing resources for each pin on an ATE is one factor driving up the cost of ATE systems.

Some lower-cost ATEs attempt to minimize per pin hardware and provide a limited number of resource intensive pins for running hardware intensive tests. This approach may add constraints to test board design as well as multi-site testing, as the limited number of ATE resources may need to be allocated to multiple device under test (DUT) pins.

Jitter measurement on clock/data signals may be a resource-intensive operation, as the timing variation introduced due to jitter is typically on the scale of a few picoseconds (ps) or smaller. A typical low-cost ATE may not include the timing sense hardware required for this measurement in production testing. A BiST scheme may enable jitter measurements and characterization with nominal ATE resources. An on-chip housekeeping analog-to-digital converter (ADC) may be used for a multitude of housekeeping operations to provide a fully digital output to the BiST scheme. An on-chip ADC may be present on a large percentage of System on a Chip (SoC) and System in a Package (SiP) modules. The BiST scheme may employ an interval-sampling scheme for high data rates that an on-chip ADC may not have the ability to handle. The statistical parameters of a Gaussian distribution may be verified to ensure that no information is lost and no artifacts are created by the BiST scheme.

Jitter and the effects of jitter are a concern, due to the limited timing margins available in modern high-speed designs. High-speed data communication may be sensitive to timing edges. Different techniques may be used in the area of designing on-chip circuits and developing algorithms to perform some level of jitter measurement on the DUT. For example, a phase frequency detector circuit may be used and jitter measurements may be performed without a reference clock. As another example, a similar scheme with a reference clock in may give out digitized measured signals. Jitter spectral extraction techniques may also be used. A time-to-voltage conversion approach which attempts to generate a voltage signal to represent the timing variation may also be used.

A BiST scheme may be used for performing jitter measurements over a moderate frequency range of input signals. The use of an onboard ADC may enable complete production quality testing of signal jitter using purely digital ATE, as the ADC outputs can be observed on external pins. In case an ADC is not available, Parametric Measurement Units (PMU)/analog measurement resources on the ATE may be used to record the analog jitter voltage signal. The analog jitter voltage signal may then be processed using the computing capability available in the ATE. This BiST solution therefore provides a low-cost ATE alternative to a typically resource intensive test.

FIG. 1 shows a system 100 for production testing 112 of a device under test (DUT) 104 with mixed signal circuitry. In one configuration, the DUT 104 may be a wireless device such as a mobile station or a base station. Alternatively, the DUT 104 may be a chip for use in a wireless device. In other configurations, the DUT 104 may not be a wireless device or part of a wireless device. The DUT 104 may include an integrated circuit 106. The integrated circuit 106 may include mixed signal circuitry. Mixed signal circuitry may be circuitry that includes both analog and digital circuitry.

The cost of testing mixed signal circuitry with a conventional analog-stimulus may be much higher than the cost of testing digital circuitry due to the higher cost of ATE required for analog stimulus generation. Multiple variants of low cost testers have been developed for digital testing which rely on relaxed timing, power or tester channel requirements to lower hardware costs. An ATE 102 may be unable to test integrated circuits 106 including mixed-signal/RF components due to the limitations of such ATE 102: the lack of analog/RF stimulus and measurement modules. Analog blocks are increasingly common on digital Application Specific Integrated Circuits (ASICs), System on a Chip (SoC) and System in a Package (SiP) modules.

A digital ATE 102 may enable full production-quality testing 112 of integrated circuits 106 by using a hybrid Built in Self Testing (BiST) scheme such as a jitter BiST 110. The jitter BiST 110 may provide a complete jitter-measurement solution which has limited silicon overhead, independence from process variations, a fully digital output to ensure compatibility with non-analog low-cost ATE, and the ability to potentially reuse some of the hardware that the SoC/SiP may already have. Special emphasis may be given to constrain the test resource requirements to be low.

One factor for using a low cost ATE 102 such as a digital ATE 102 to test mixed signal integrated circuits 106 is an on-chip generated self-test stimulus. The self-test stimulus may generate an input or signal for testing purposes. A low-cost ATE 102 may be unable to provide a test stimulus externally. The jitter BiST 110 may include a self-test stimulus. A self-test stimulus may provide a ramp input with a well characterized linear slope.

Ramp generation schemes requiring a negative voltage supply on the DUT 104 for process variation testing may be used. However, a negative voltage supply on the DUT 104 is rare for modern SoC and SiP systems. An integrated circuit 106 with a self-test stimulus may be production tested 112 without the need of additional positive or negative power supplies, other than the native supplies for the ADC and buffers.

Figure 2:
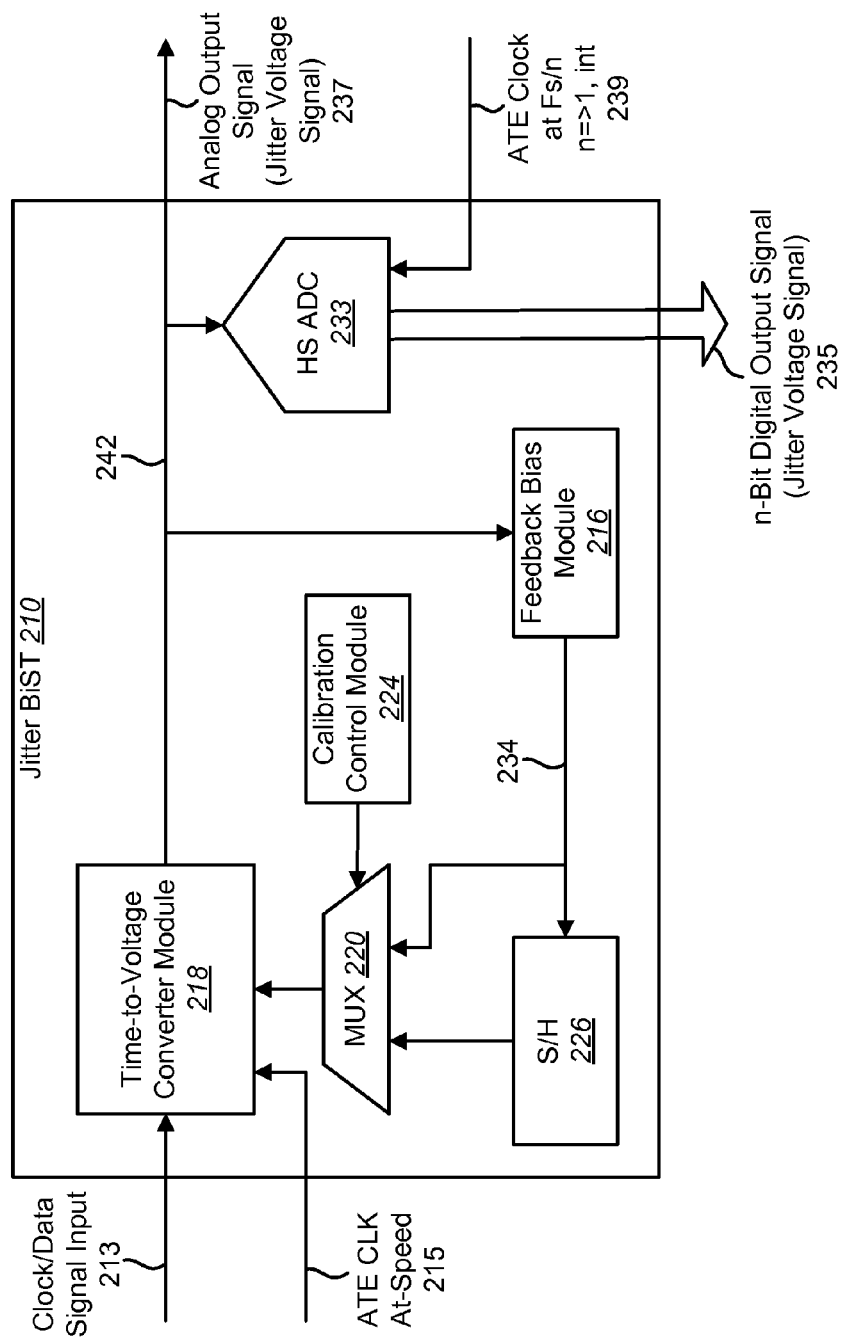
FIG. 2 is a block diagram illustrating various components of one configuration of a jitter Built in Self Testing (BiST)

FIG. 2 is a block diagram illustrating various components of one configuration of a jitter BiST 210 block or component. The jitter BiST 210 of FIG. 2 may be one example of the jitter BiST 110 of FIG. 1. Timing variation in a clock or data signal is typically on the order of a few picoseconds and hence it is a very small fraction of the actual period of the affected signal. Due to this nature of period jitter, high precision timing measurement hardware may be required to accurately measure and characterize signal jitter. Typical timing generation/measurement circuitry present on ATE 102 cannot perform these measurements and requires additional precision timing hardware—further increasing the ATE 102 cost. While picosecond-scale timing measurements require precision circuitry, the voltage generation and measurement systems provided on typical ATE 102 can measure signals of the order of a few micro (or even nano) volts. Hence, a scheme to represent the jitter timing variation in terms of a voltage signal may be used, where the voltage is a function of the timing variation. Since the jitter timing variation is a small fraction of the signal frequency, adequate voltage resolution may be provided by using reference voltages derived from SPICE simulations. A band-gap voltage source may also be used for internal voltage reference if the process technology used allows the dynamic voltage value.

A clock/data signal input 213 may be fed to a time-to-voltage converter module 218. The time-to-voltage converter module 218 may generate a voltage signal 242 proportional to the timing jitter present in the clock/data signal input 213. The Gaussian nature of jitter in the clock/data signal input 213 may be maintained, as the time-to-voltage converter 218 has a linear response to the input timing variation. The slope of this transformation may be a function of the resolution of the time-to-voltage converter 218 and process variations, as it may affect the current drive of a constant current source used inside the time-to-voltage converter 218.

A reference voltage may be provided to the time-to-voltage converter 218 based on the process corner analysis done in SPICE simulations to improve the output linearity and make the measurements independent of process variations. The dynamic range may be made to cover the entire supply-to-ground rail voltage scale available or to cover a compress output swing, depending on the circuit conditions. A feedback system such as a feedback bias module 216 may be implemented to compensate for process variations. The feedback bias module 216 is discussed in further detail below in relation to FIG. 9. The feedback bias module 216 may receive the output 242 from the time-to-voltage converter 218 in the calibration mode. The feedback bias module 216 may provide a stable feedback voltage node 234 to the time-to-voltage converter 218 at the end of calibration process. Through a multiplexer (MUX) 220, the time-to-voltage converter 218 may receive a calibration signal from a calibration control module 224 during calibration mode, which is stored into the sample-and-hold (S/H) circuit 226 at the end of calibration mode. The time-to-voltage converter 218 may also receive an ATE CLK at-speed signal 215 from the ATE 102. This at-speed signal may synchronously operate at the same frequency as all the other clock signals used in this system.

Figure 3:
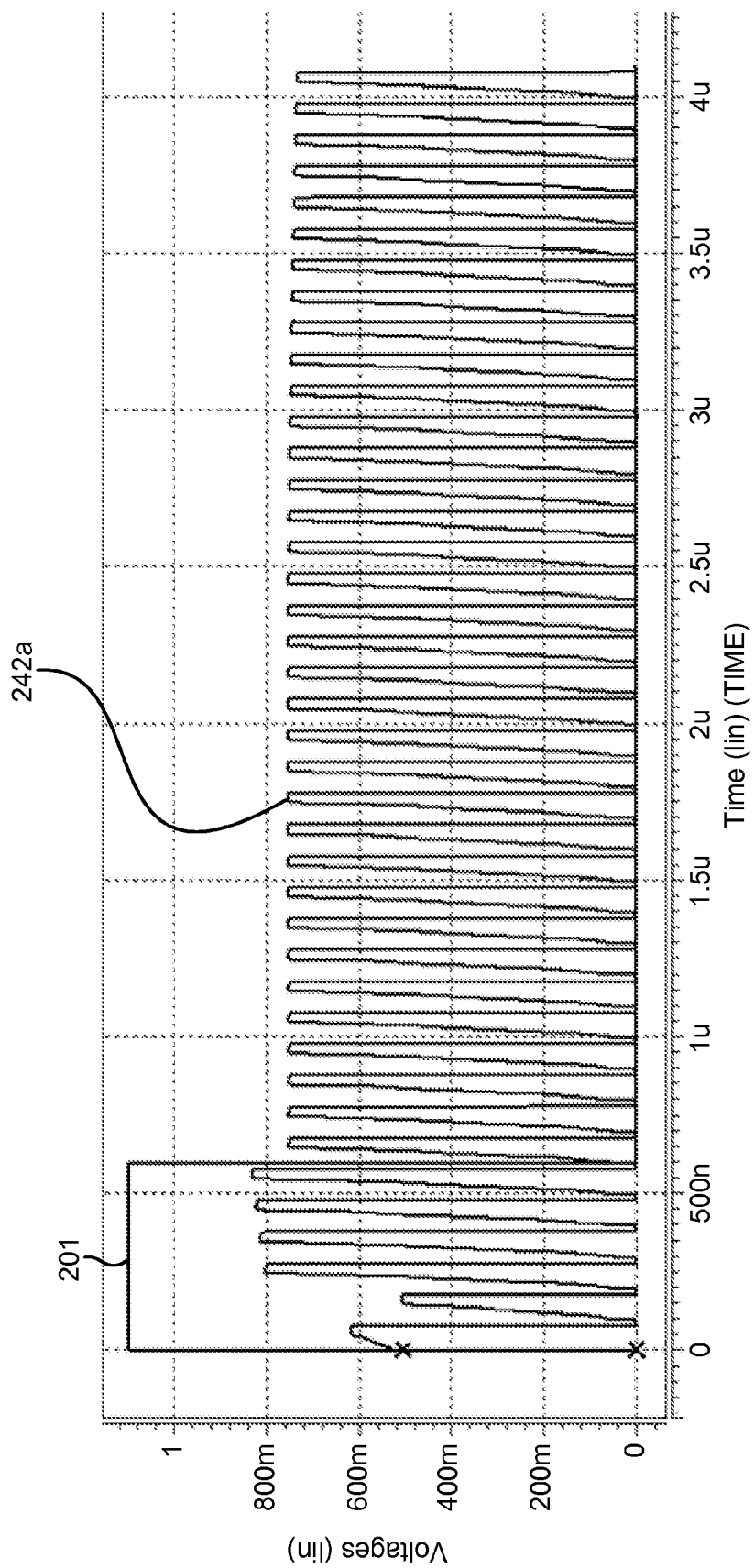
FIG. 3 illustrates a calibration process waveform.

The time-to-voltage converter 218 may require multiple cycles of operation in calibration mode to adjust bias voltages associated with the feedback bias module 216. A calibration process waveform is shown in FIG. 3. The calibration control module 224 may provide the control signals required to perform calibration, which is essential to ensure process independence. After calibration, the jitter BiST 210 may be put into test mode when the actual time-to-voltage conversions for the clock/data signal input 213 begin. The control module may switch over to the S/H circuit 226 to provide the set bias voltage once the calibration process is complete. In mission or test mode, an analog voltage 242 proportional to the timing jitter value present in each cycle of the clock/data signal input 213 may be produced at the output of the time-to-voltage converter 218.

As the duty cycle of the clock/data signal input 213 is used as a charging switch to a capacitor in the time-to-voltage converter 218, any jitter present in the clock/data signal input 213 may affect the charging duration of the capacitor. It is expected that this $\delta T_{charge}$ value would be a fraction of the overall time period, hence producing a small $\delta V_{cap}$ across the capacitor. To ensure that an adequate resolution is available for $\delta V_{cap}$, a reference voltage may be used to bias the ADC $V_{low}$ reference based on the process variation results obtained in SPICE simulations. The ADC $V_{low}$ voltage refers to the non-zero lower voltage reference used internally instead of ground in order to achieve a full output swing for an input swing lower than the rail-to-rail value. The variation in $\delta V_{cap}$ due to period variation may be explained using Equation (1):

$$V = Q/C, V = \frac{1}{C} \times^t \int_0^t \frac{di}{dt}. \quad (1)$$

From Equation (1), Equation (2) may be derived:

$$\delta V = \frac{1}{C} \times \left[ t^+ \int_0^{t^+} \frac{di}{dt} - t^- \int_0^{t^-} \frac{di}{dt} \right]. \quad (2)$$

The use of an on-chip flash ADC 233 may perform digital conversion of the jitter voltage signal 242 so that a digital output 235 representing the input jitter can be obtained on-chip and ATE 102 may be used for production testing 112. Flash ADCs 233 are not commonly used for low-speed operations due to the area overheads. The successive approximation ADCs 233 (SA-ADC) used typically have sampling rates which may be below the requirements for high speed clock/data signals. If a slower housekeeping ADC 233 such as a SA-ADC 233 is available on the SoC/SiP for housekeeping applications, an interval-sampling scheme can be used. The interval sampling may be achieved by supplying a synchronous clock of integrally divisible frequency to the time-to-voltage converter 218 and the ADC 233. If $F_{signal}$ is the input signal frequency, the time to voltage converter 218 and the ADC 233 modules operate at $F_{signal}/N$, where N is an integer.

If the clock/data signal input 213 being processed is at the frequency of $F_{signal}$, the ADC 233 sampling frequency may be set to $F_{ADC}$, where $F_{signal}$ is an integral multiple of $F_{ADC}$, both signals being synchronous in the time domain. For example, for measuring a 200 megahertz (MHz) signal, an ADC 233 clocked at 200/n MHz synchronous clock may be used, where "n" is an integer. Thus, a lower sampling rate may be used, which may result in discarding of some of the samples without the loss of information about the distribution. The lower sampling rate may marginally increase the test time, as a longer jitter-voltage-string may need to be captured for the same confidence level in measurements, but use of significantly lower cost ATE 102 may compensate for the added test time. The available on-chip ADC 233 may be clocked with an input clock frequency 239 of $F_s/N$—the synchronous integral divided clock derived from the main at-speed clock.

If an on-chip ADC 233 is not present on the DUT 104, the analog output 237 of the time-to-voltage converter 218 can be measured using the analog instrumentation of the ATE 102. Depending on the data rate of the clock/data signal input 213, either the Per Pin Measurement Units (PPMU) can be utilized or analog measurement resources can be used for higher speeds. Though not as cost-effective as using a low-cost ATE 102 (with a purely digital output scheme), this has a significantly lower cost than conventional jitter measurement systems, as it eliminates the high cost of the precision timing circuitry needed for jitter measurement.

FIG. 3 illustrates a calibration process waveform. A $CAL_{enable}$ signal 201 is shown superimposed on the time-to-voltage converter 218 output 242a. In one possible configuration, the output voltage 242a amplitude of the time-to-voltage converter 218 may increase from 0 volts (V) during boot-up to generate a voltage signal of voltage value $V_1$ at the output for a jitter-free period provided as the input. A faster process corner may cause the capacitor in the time-to-voltage converter 218 to charge to a voltage greater than $V_1$ per cycle as the current source injects higher than nominal current. The current source is discussed in more detail below. The feedback circuit 216, connected to the time-to-voltage converter 218 during the calibration state, may provide a negative feedback by reducing the bias voltage at the control node of the current source. The feedback circuit 216 may provide a positive feedback if the output node fails to reach $V_1$, which increases the bias voltage to the current source control node to ensure the consistent current source value. This hybrid feedback may be achieved by voltage sampling of the output node.

Figure 4:
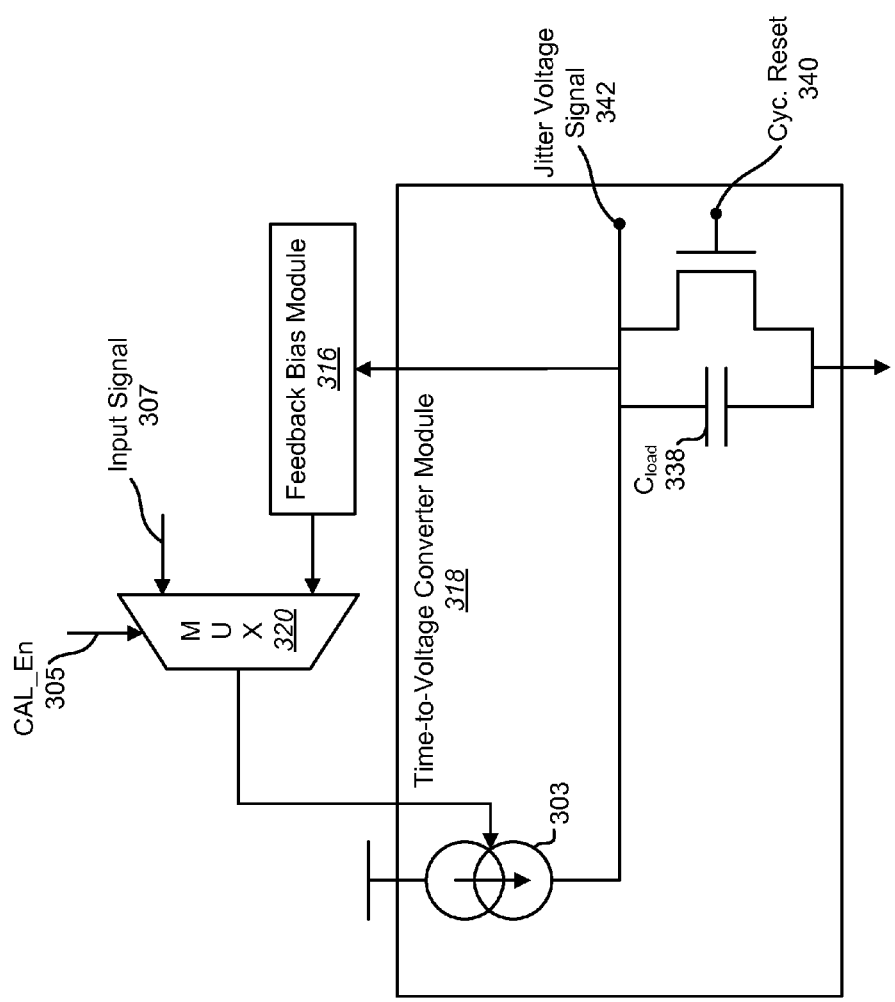
FIG. 4 is a block diagram illustrating a time-to-voltage converter module with feedback for process independence.

FIG. 4 is a block diagram illustrating a time-to-voltage converter module 318 with feedback for process independence. The time-to-voltage converter module 318 may receive, through a multiplexer (MUX) 320, a calibration input (CAL_EN) 305, an input signal 307, and feedback from a feedback bias module 316. When the input signal jitter is to be measured in mission mode, the input signal 307 may be used to drive/control a constant current source 303 which charges a capacitor $C_{load}$ 338. As the input signal phase drives the transmission gate that acts as a switch to the capacitor 338, the charge stored on the capacitor 338 may be proportional to the duty cycle of the input signal 307. Thus, the voltage across the capacitor 338 may represent a jitter voltage signal 342. A cyclic reset signal 340 may be applied to the capacitor 338 to discharge the capacitor 338 between two successive cycles. Functionally, a ramp generator, with the ramp amplitude controlled by the input signal, may be used to generate the voltage representation of the jitter signal. The use of a ramp generator is discussed in more detail below in relation to FIG. 8.

Figure 5:
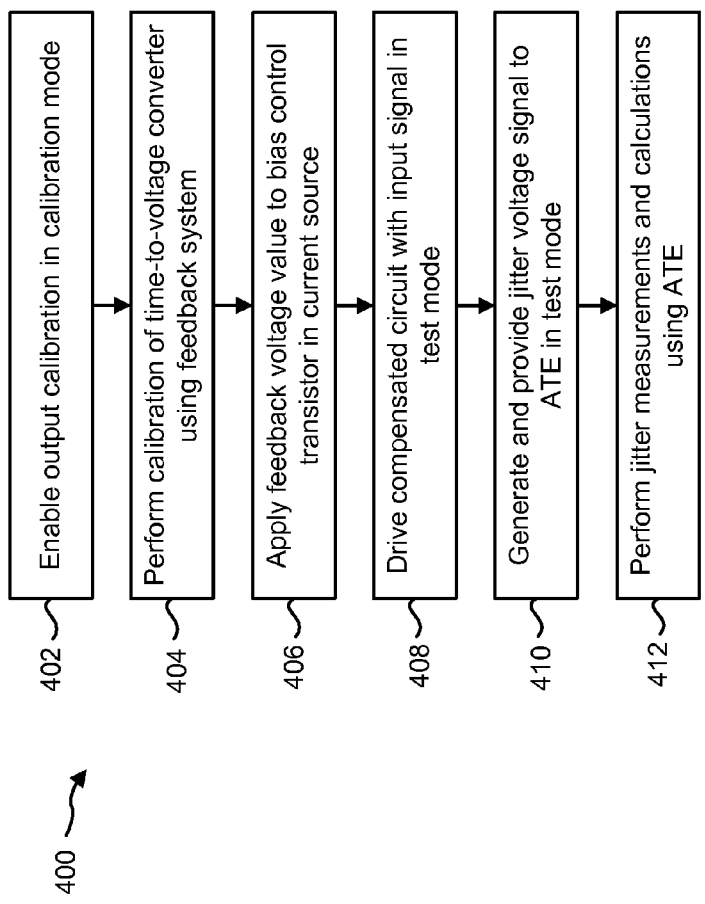
FIG. 5 is a flow diagram illustrating a method for BiST jitter measurement with low-cost automatic test equipment (ATE) compatibility.

FIG. 5 is a flow diagram illustrating a method 400 for BiST jitter measurement with low-cost automatic test equipment (ATE) 102 compatibility. A jitter BiST 110 may be part of an integrated circuit 106. The jitter BiST 110 may include a time-to-voltage converter 218. Output calibration of the jitter BiST 110 in calibration mode may be enabled 402. A feedback system may perform 404 calibration of the time-to-voltage converter 218. The feedback voltage value may be applied 406 to the bias control transistor in a current source.

The compensated circuit may be driven 408 by an input signal in test mode. A jitter voltage signal may be generated and provided 410 to the ATE 102 in test mode. The ATE 102 may then perform 412 jitter measurements and calculations.

Figure 5A:
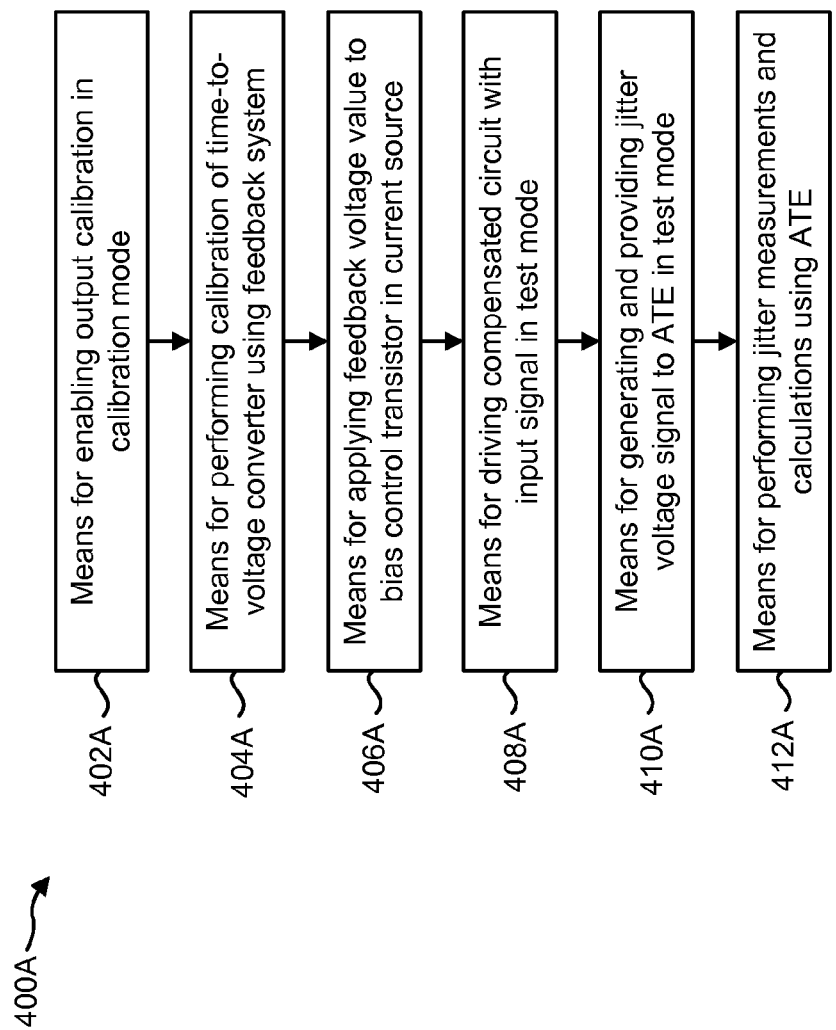
FIG. 5A illustrates means-plus-function blocks corresponding to the method of FIG. 5.

The method 400 of FIG. 5 described above may be performed by various hardware and/or software component(s) and/or module(s) corresponding to the means-plus-function blocks 400A illustrated in FIG. 5A. In other words, blocks 402 through 412 illustrated in FIG. 5 correspond to means-plus-function blocks 402A through 412A illustrated in FIG. 5A.

Figure 6:
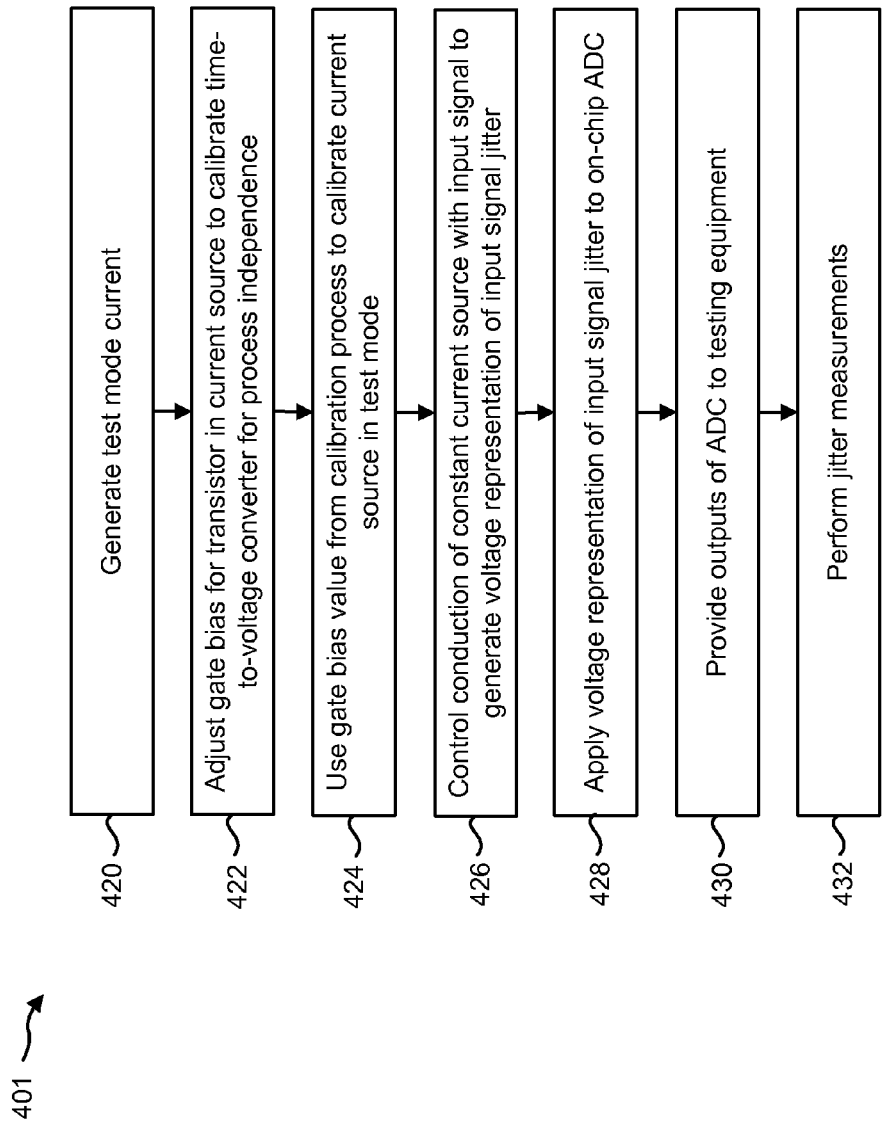
FIG. 6 is a flow diagram illustrating another method for BiST jitter measurement with low-cost ATE compatibility.

FIG. 6 is a flow diagram illustrating another method 401 for BiST jitter measurement with low-cost ATE 102 compatibility. A jitter BiST 110 may be part of an integrated circuit 106. Jitter measurements for the integrated circuit 106 may be necessary or desired. A constant current source 303 on the integrated circuit 106 may generate 420 a test mode current. The gate bias for a transistor in the constant current source 303 may be adjusted 422 to calibrate the time-to-voltage converter 218 for process independence. The gate bias value from the calibration process may be used 424 to calibrate the current source 303 in test mode.

The conduction of the constant current source 303 may be controlled 426 with an input signal to generate a voltage representation 342 of the input signal jitter. The voltage representation of input signal jitter may be applied 428 to an on-chip ADC.

The voltage representation 342 of the input signal jitter may be a linearly increasing voltage generated by a ramp generator. A feedback circuit may adjust 424 the gate bias for a transistor in the constant current source 303 to calibrate the time-to-voltage converter 218 for process independence.

The time-to-voltage converter 218 may apply 426 the voltage representation 242 of the output signal jitter to an on-chip ADC 233 and the ADC 233 may output a digital signal 235. The ADC 233 may provide 428 the outputs of the ADC 233 to testing equipment such as an ATE 102. The testing equipment may then perform 430 jitter measurements on the outputs of the ADC 233. Outputs of the ADC 233 may be provided to testing equipment. The testing equipment may then perform jitter measurements.

Figure 6A:
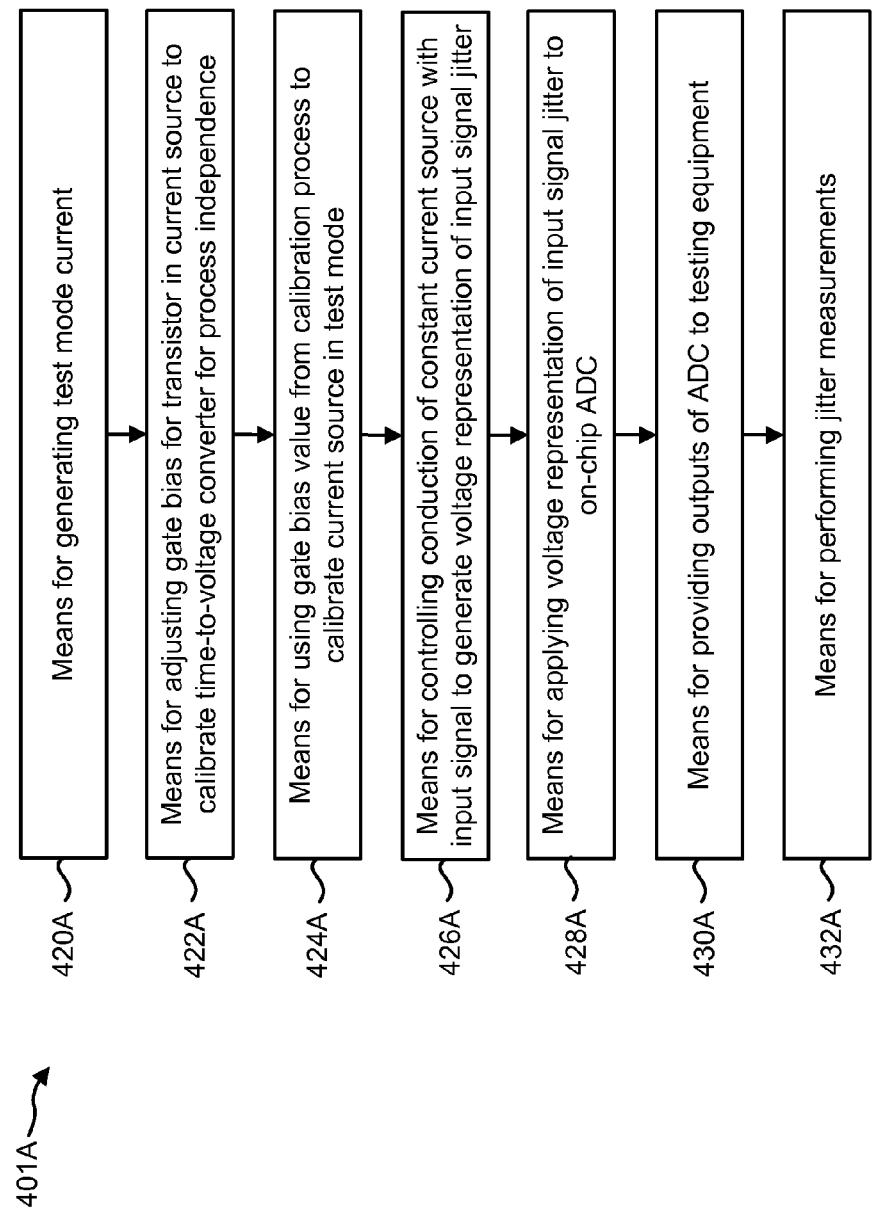
FIG. 6A illustrates means-plus-function blocks corresponding to the method of FIG. 6.

The method 410 of FIG. 6 described above may be performed by various hardware and/or software component(s) and/or module(s) corresponding to the means-plus-function blocks 401A illustrated in FIG. 6A. In other words, blocks 420 through 430 illustrated in FIG. 6 correspond to means-plus-function blocks 420A through 430A illustrated in FIG. 6A.

Figure 7:
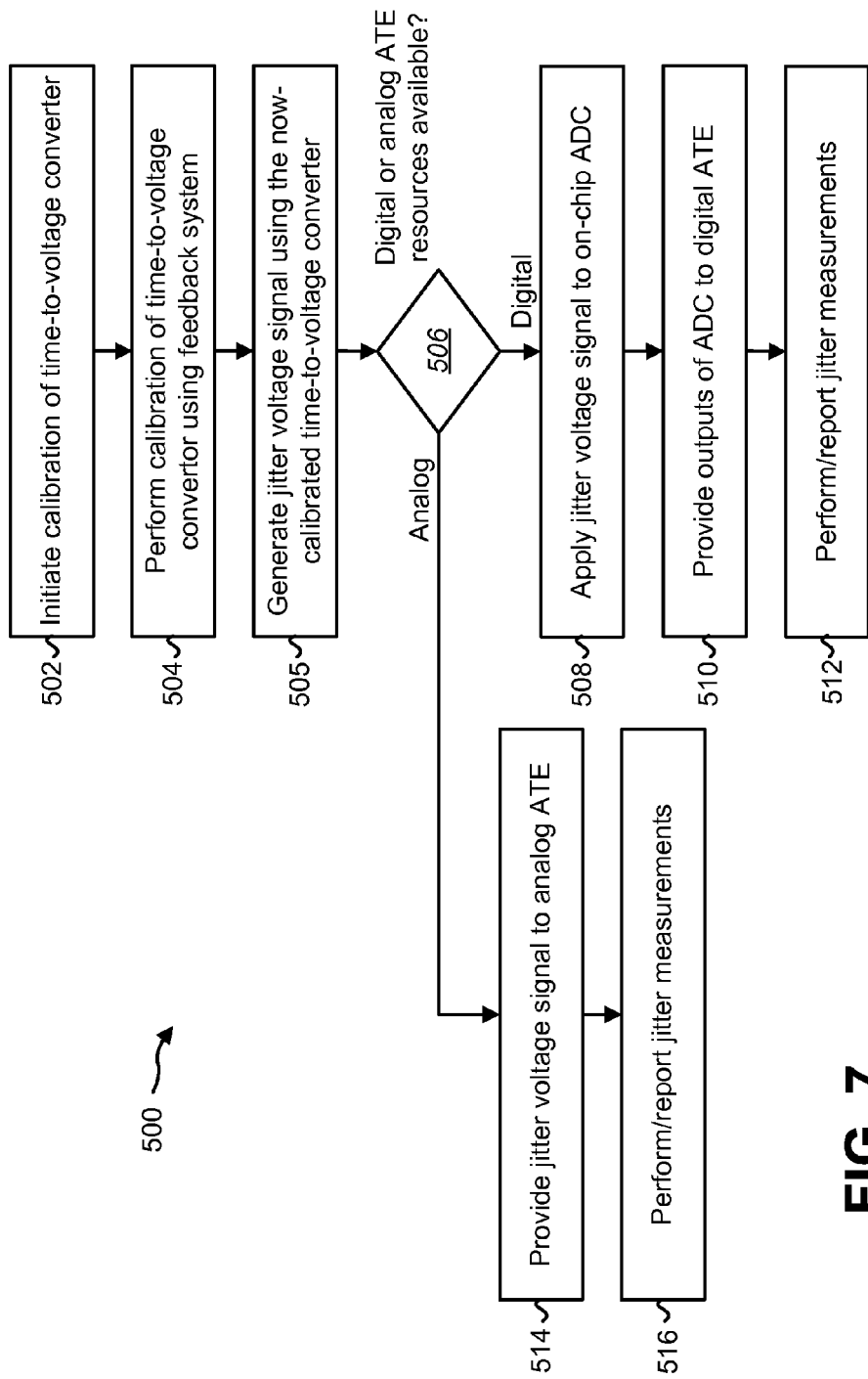
FIG. 7 is a flow diagram illustrating a method for BiST jitter measurement.

FIG. 7 is a flow diagram illustrating a method 500 for BiST jitter measurement. A time-to-voltage converter 218 on the jitter BiST 210 may be initiated 502 for calibration before test mode measurements are started. A feedback system may perform 504 calibration of the time-to-voltage converter 218. A jitter voltage signal may be generated 505 from the input timing jitter by using the calibrated time-to-voltage converter module 218. The jitter voltage signal may be proportional to timing jitter present in a clock/data signal input. It may need to be determined 506 whether the ATE 102 resources used for measuring the jitter voltage signal 242 are analog or digital in nature. Analog resources may include the ATE 102 PPMU resources while the digital resources may include ATE 102 digital channels. If the ATE 102 resources available are analog, the time-to-voltage converter module 218 may provide 514 the jitter voltage signal 242 to the analog ATE 102. The analog ATE 102 resources may then perform/report 516 jitter measurements on the jitter voltage signal 242.

If the ATE 102 resources available are digital ATE 102, the time-to-voltage converter 218 may apply 508 the jitter voltage signal 242 to an on-chip ADC 233. The ADC 233 may provide 510 outputs of the ADC 233 to digital ATE 102. The digital ATE 102 may then perform/report 512 jitter measurements on the jitter voltage signal 242.

Figure 7A:
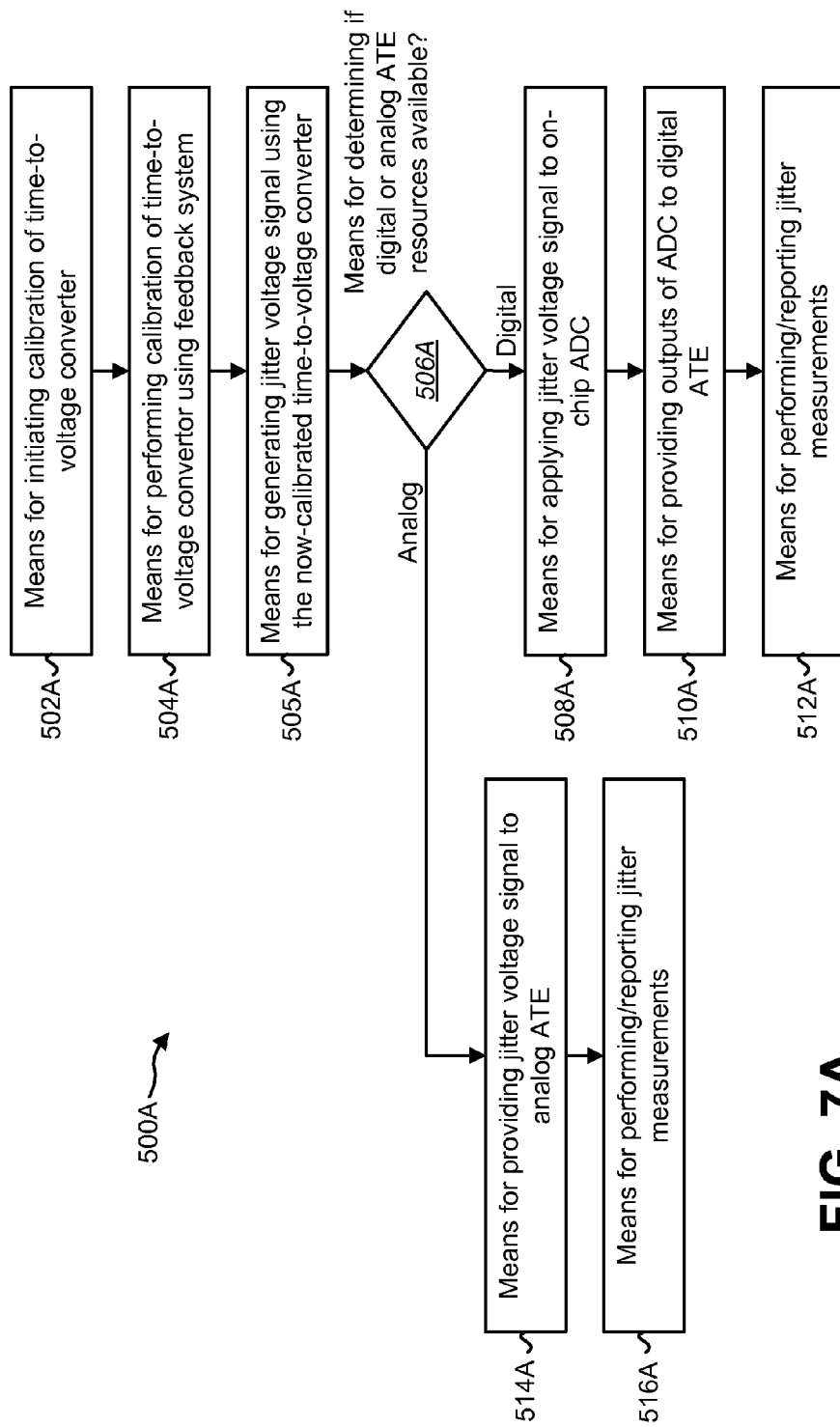
FIG. 7A illustrates means-plus-function blocks corresponding to the method of FIG. 7.

The method 500 of FIG. 7 described above may be performed by various hardware and/or software component(s) and/or module(s) corresponding to the means-plus-function blocks 500A illustrated in FIG. 7A. In other words, blocks 502 through 516 illustrated in FIG. 7 correspond to means-plus-function blocks 502A through 516A illustrated in FIG. 7A.

Figure 8:
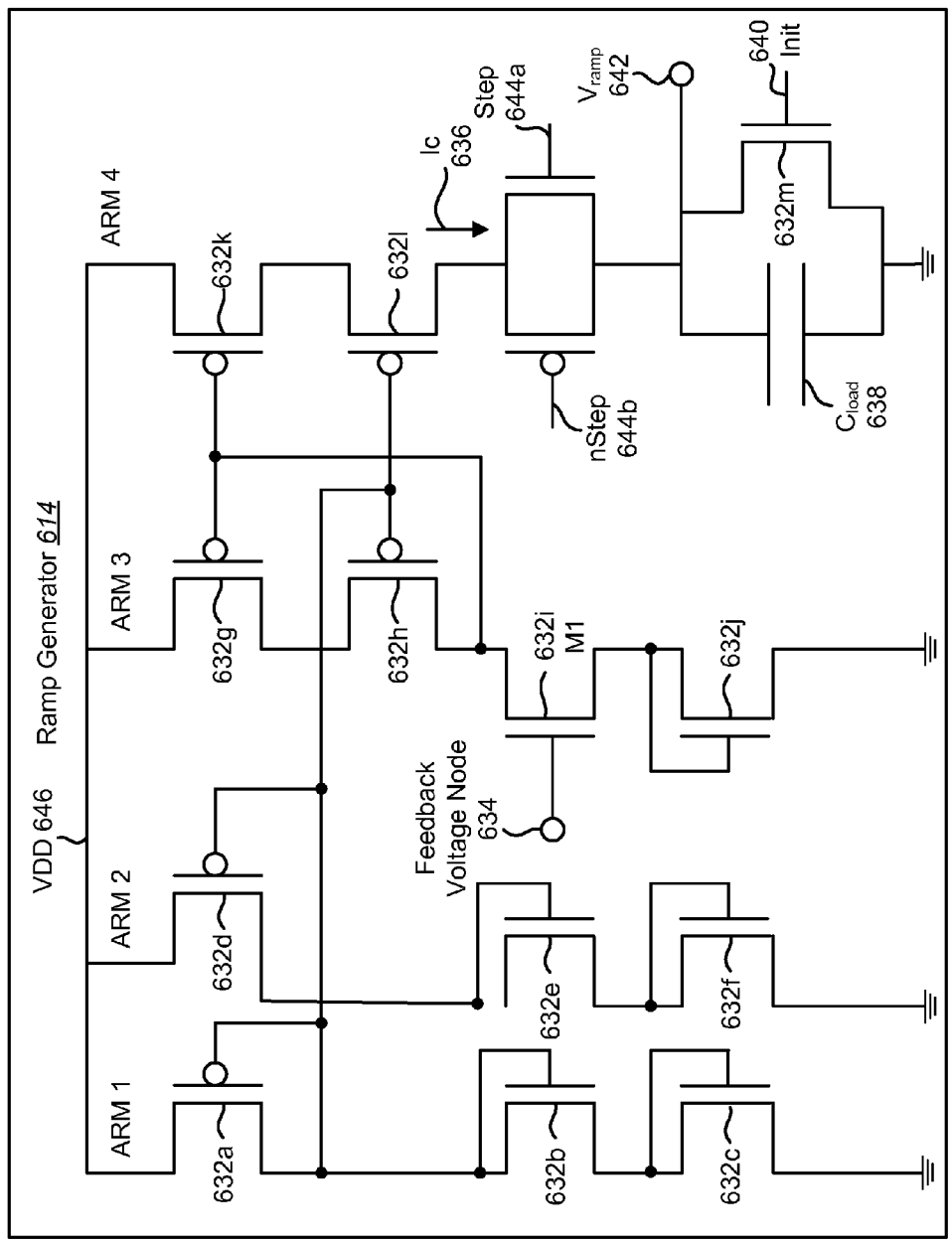
FIG. 8 is a circuit diagram illustrating one configuration of a ramp generator for use in the present systems and methods.

FIG. 8 is a circuit diagram illustrating one configuration of a ramp generator 614 for use in the present systems and methods. The ramp generator 614 may be one version of the time-to-voltage converter module 218 of FIG. 2. The ramp generator 614 may be connected to a supply voltage, VDD 646. The ramp generator 614 may include a constant current source. A constant current source providing a current i may provide a current value between "i+error_margin" to "i−error_margin", where "error_margin" and "i" can be application specific and can lie in any numerical range, depending on the application. The constant current source may be implemented using multiple transistors 632a-m arranged in a fashion to produce a constant current 636, as shown in the circuit diagram of FIG. 8. A current mirror circuit using semi-telescopic topology may produce the constant current 636. For the ramp generator 614 to have a constant-slope-constant period ramp as an input, a precise current and capacitance value may be essential. If 0 V to VDD is the input swing specification for the ramp generator 614, the input ramp should reach VDD at a time period t' for each cycle. Process variations may affect the ramp slop and linearity, and hence make the ramp generator 614 of very limited use for production testing.

Constant current charging of a capacitor C linearly increases the voltage across the plates. Any process variation causing a change in capacitance would inversely affect the ramp voltage slope. Similarly any variation in the current drive of the charging circuit would affect the charging time as shown in Equation (3):

$$C = \frac{Q}{V}, V_{cap} \propto \frac{1}{C}. \tag{3}$$

Hence, Equation (4):

$$\delta V_{cap} \propto \frac{1}{\delta C}. \tag{4}$$

SPICE simulations run for cold-nominal-hot process corners indicate that for the ramp generator without feedback, a very precise process target would be required to maintain the required ramp slope, making it impractical for production testing 112. A feedback scheme may provide controllability of the ramp. The feedback scheme may be a variable feedback which can maintain a constant voltage ramp slope for process variations in the capacitor or constant current source circuit. This feedback may be dynamic to ensure complete process corner independence.

The use of multiple clocks may limit multi-site production testing. Furthermore, a low-cost ATE 102 may have a limited number of clocking resources available. To maintain low-cost ATE 102 compatibility, the components on the integrated circuit 106 may need to use clocks with a 50 percent duty cycle. The high speed asynchronous clocks available on low-cost ATE 102 may be free running phase locked loop (PLL) outputs. A 50 percent duty cycle PLL-generated clock may be produced on most low-cost ATE 102 at the required high frequencies. Using phase-shifted limited duty cycle clocks may require greater system resources and may not be within the capabilities of a typical low-cost ATE 102. No additional (or negative) power supplies are required for the jitter BiST 210 apart from the native supplies for the DUT/buffers.

The constant current 636 may then be applied to a capacitor $C_{load}$ 638. In one configuration, $C_{load}$ 638 may be a 10 pico-Farad (pF) capacitor. The voltage across $C_{load}$ 638 may be referred to as $V_{ramp}$ 642. The voltage across $C_{load}$ 638 may increase linearly as the constant current 636 charges $C_{load}$ 638. An initialization signal Init 640 may be provided to the ramp generator 614 to initiate production testing 112.

The ramp generator 614 may receive feedback from a feedback circuit 216. The gate bias for transistor M1 632*i* may depend on the feedback circuit 216. For example, the gate of transistor M1 632*i* may be set to the feedback voltage node 634. An increase in the feedback voltage node 634 may decrease the constant current 636 of the ramp generator 614. A decrease in the constant current 636 of the ramp generator 614 may increase the charging time of the capacitor $C_{load}$ 638. Likewise, a decrease in the feedback voltage node 634 may increase the constant current 636 of the ramp generator 614 and decrease the charging time of the capacitor $C_{load}$ 638. The charging time of the capacitor $C_{load}$ 638 may also be referred to as the settling time of the ramp generator 614. The settling time for the ramp generator 614 may be a factor in production testing 112 because testing may not begin until a consistent ramp slope has been obtained. Therefore, it may be desirable for the output ramp to stabilize in the minimal possible time. The ramp generator 614 may receive Step 644*a* and nStep 644*b*. Step 644*a* and nStep 644*b* may be fed the system differential clock in order to enable conduction of the constant current to $C_{load}$ 638. Step 644*a* and nStep 644*b* may prevent $C_{load}$ 638 from charging during a reset phase when $C_{load}$ 638 is shorted using Init 640 with transistor 640*m*. This prevents a short circuit and excessive current flow through $C_{load}$ 638.

Figure 9:
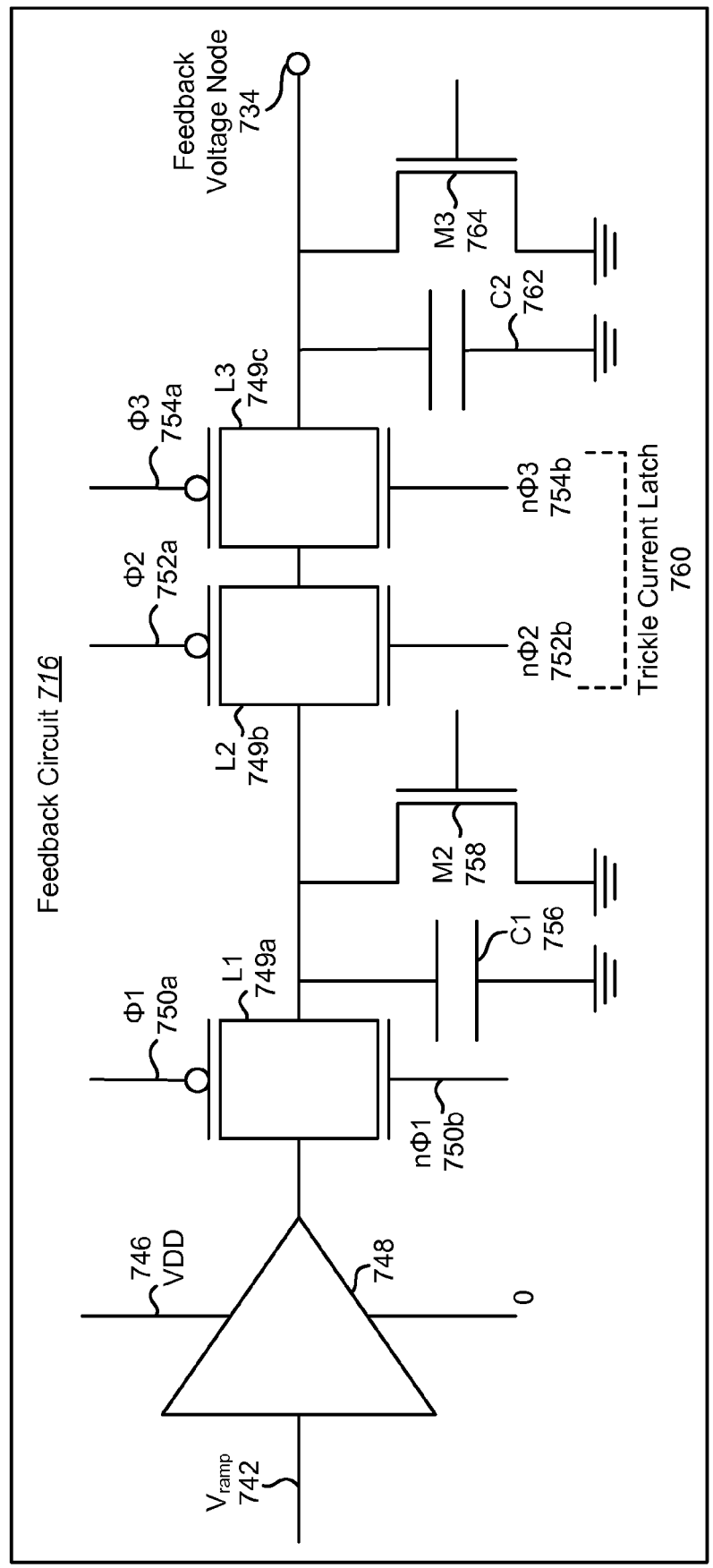
FIG. 9 is a circuit diagram illustrating one configuration of a feedback circuit for use in the present systems and methods.

FIG. 9 is a circuit diagram illustrating one configuration of a feedback circuit 716 for use in the present systems and methods. The input of the feedback circuit 716 may be tied to the output $V_{ramp}$ 742 of the ramp generator 614. A clocked comparator 748 may be used to compare the ramp output $V_{ramp}$ 742 with VDD/2 at the time Tper/2, where Tper is the ramp period.

Transistor M2 758 may be used to reset capacitor C1 756. Capacitor C1 756 may be used as a per-cycle-charge-storage for the clocked comparator 748 output. If $V_{ramp}$ 742 is less than VDD/2 at Tper/2, the voltage across C1 756 may be set to VDD 746. Otherwise, the voltage across C1 756 may be set to 0 volts. The feedback circuit may also include multiple latches L1 749*a*, L2 749*b* and L3 749*c*. Latch L1 749*a* may be controlled with a clocking resource that has phases φ1 750*a* and *n*φ1 750*b*. Latch L2 749*b* may be controlled with a clocking resource that has phases φ2 752*a* and *n*φ2 752*b*. Latch L3 749*c* may be controlled with a clocking resource that has phases φ3 754*a* and *n*φ3 754*b*. Latches L2 749*b* and L3 749*c* may be referred to as a combination latch or a trickle current latch 760. Latches L2 749*b* and L3 749*c* may be toggled by an offset clock to limit the conductive phase of the combination latch such that the offset phase φ3 754*a* is given by Equation (5):

$$\phi3 = \phi1 \cap \phi2. \tag{5}$$

Phase φ2 752*a* and φ3 754*a* may be generated by using a single clocking resource—the phase difference generated by adding wide-gate delay. Phase φ3 754*a* lags phase φ2 752*a* by this delay amount. This phase offset limits the effective conduction cycle through this dual-latch as explained in Equation (5). The offset phase φ2 752*a* may be generated out of an oversized gate delay such that no clocking source overhead is required. When L2 749*b* and L3 749*c* conduct, C1 756 is connected in parallel with a second capacitor C2 762, and a charge sharing current flows to equalize the voltage across each capacitor according to Equation (6):

$$I \text{ charge-sharing} = \frac{d}{dt}\left[\frac{v_1 - v_2}{c_1 + c_2}\right]. \tag{6}$$

The voltage across capacitor C2 762 may be used to change the bias current in the constant current source of the ramp generator 614 because the voltage across capacitor C2 762 is the feedback voltage node 634,734 applied to the gate of transistor M1 632*i* from FIG. 8 above. The voltage across capacitor C2 762 may also be referred to as $V_{ramp}$. If $V_{ramp}$ is less than a reference voltage $V_{ref}$ in the clocked comparator 748 at Tper/2, C1 756 may charge C2 762 to a higher voltage value. If $V_{ramp}$ is greater than $V_{ref}$ at Tper/2, the voltage across C1 756 may be set to 0 volts, and C1 756 may partially discharge C2 762, lowering the effective voltage across C2 762. A reduction in voltage across C2 762 means a lower gate bias for the current mirror used in the constant current source of FIG. 8, thereby reducing the load charging current 636.

C1 756 and C2 762 may each be designed to be of low capacitive value to minimize the layout area overhead. Using wide transistors for the latches L2 749*b* and L3 749*c* may enable rapid charge sharing between C1 756 and C2 762 due to increased conductivity. Using wide transistors for the latches L2 749*b* and L3 749*c* may also result in $V_{ramp}$ overshoot and undershoot, as excessive correction bias may be applied to the constant current source of the ramp generator 614. The transistor widths for the latches L2 749*b* and L3 749*c* may be optimized to stabilize $V_{ramp}$ in approximately 6-7 cycles. The reference voltage $V_{ref}$ in the clocked comparator 748 may typically be maintained at VDD/2 and may be generated on the integrated circuit 106 by matched load sharing. Transistor M3 764 may provide a reset option for the feedback biasing voltage when the circuit is initialized.

Figure 10:
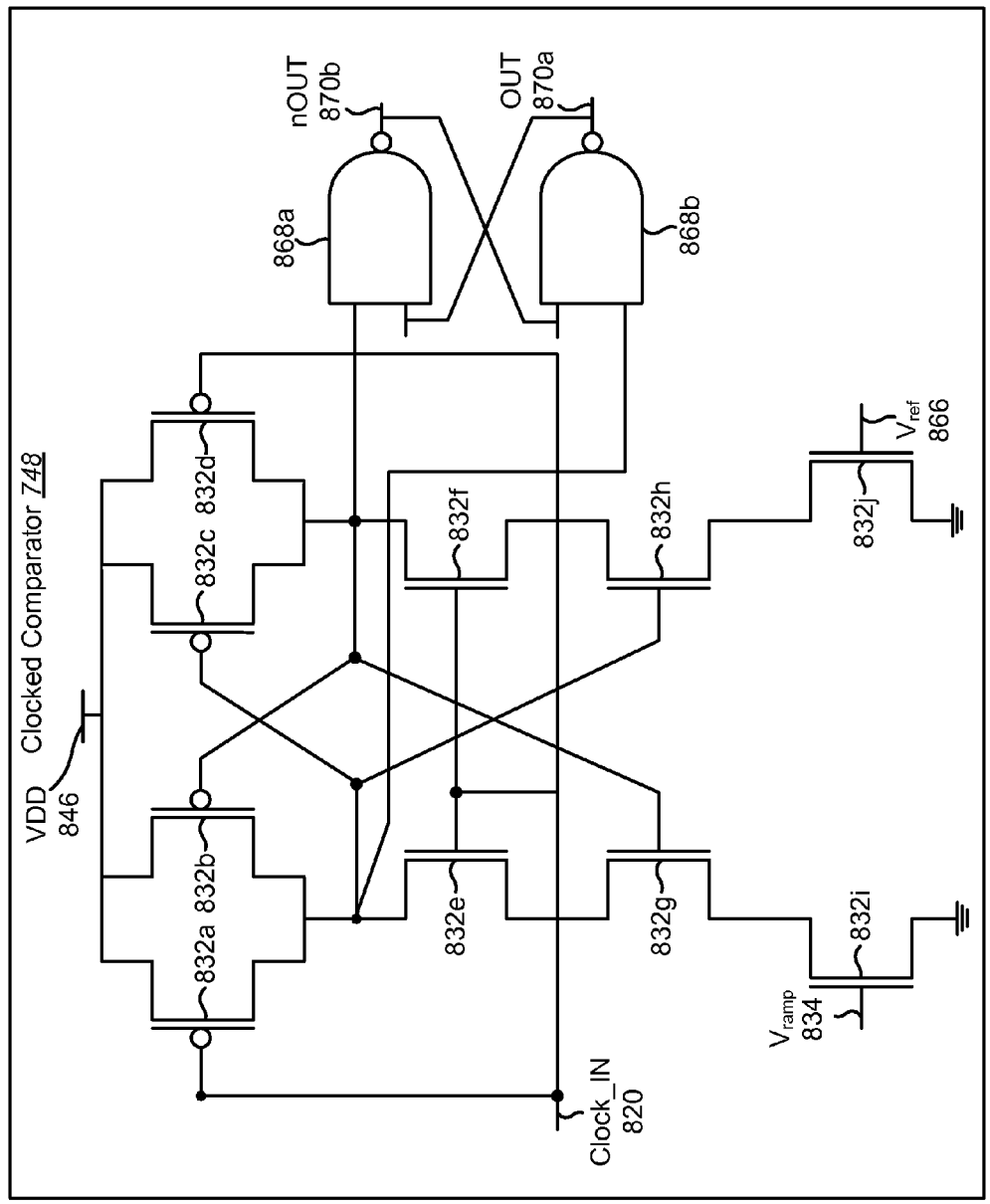
FIG. 10 is a circuit diagram illustrating one configuration of a clocked comparator for use in the present systems and methods.

FIG. 10 is a circuit diagram illustrating one configuration of a clocked comparator 748 for use in the present systems and methods. The clocked comparator 748 may be used as part of the feedback circuit 216. The clocked comparator 748 may include multiple transistors 832*a-j* connected between VDD 846 and ground, along with two NAND gates 868*a*, 868*b*, as shown in FIG. 8. The clocked comparator 748 may use a Clock_IN 820 to control two of the transistors 832*a*, 832*d*. Other configurations for clocked comparators 748 may be used in the jitter BiST 110.

The clocked comparator 748 may receive $V_{ramp}$ 834 as the gate voltage to transistor 832*i*. The clocked comparator may also receive $V_{Ref}$ 866 as the gate voltage to transistor 832*j*. As discussed above in relation to FIG. 9, the clocked comparator 748 may output 870*a* a voltage VDD 846 if $V_{ramp}$ 834 is less than VDD/2 at Tper/2. Otherwise, the clocked comparator 748 may output 870*a* a voltage of 0 volts. Outputs 870*a* and 870*b* are mutually inverted and either of the two may be used in the feedback path, depending on the application. The remaining output may remain unused.

Figure 11:
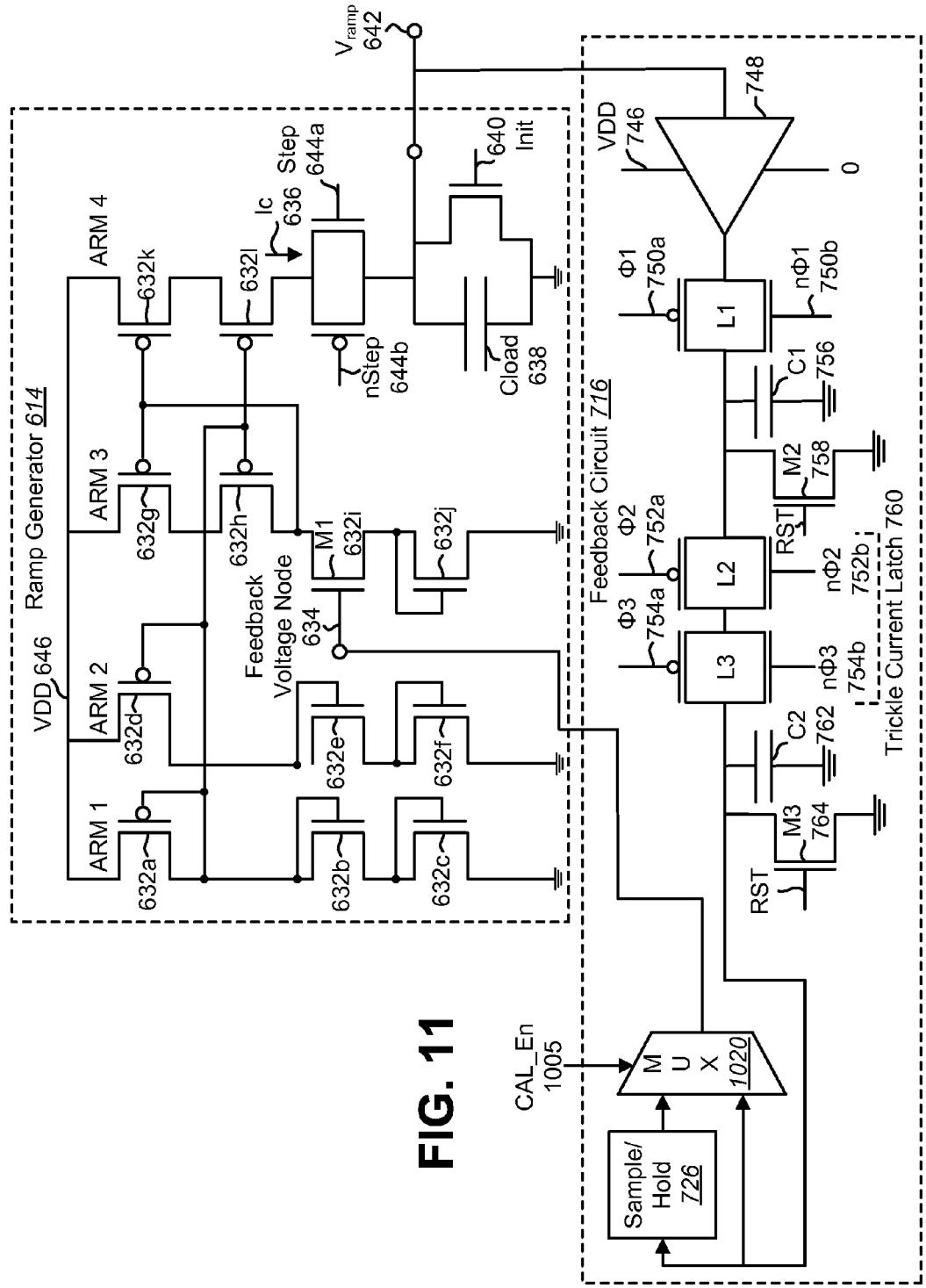
FIG. 11 is a circuit diagram illustrating one configuration of a jitter BiST with low-cost ATE compatibility.

FIG. 11 is a circuit diagram illustrating one configuration of a jitter BiST 210 with low-cost ATE 102 compatibility. The output $V_{ramp}$ 642 of a ramp generator 614 may be input to a feedback circuit 716. The output 634 of the feedback circuit 716 may be input into a multiplexer (MUX) 1020. The output 634 of the feedback circuit 716 may also be passed through a sampled and hold circuit 726 and input into the MUX 1020. The MUX 1020 may also receive a calibration signal (CAL_En) 1005. The output of the multiplexer may be the feedback voltage node 634. The feedback voltage node 634 may be input to the gate of transistor M1 632i of the ramp generator 614, thereby influencing the current source and ramp time of the ramp generator 614. FIG. 11 is a circuit diagram illustrating how the circuits of FIGS. 8 and 9 may be interconnected.

Figure 12:
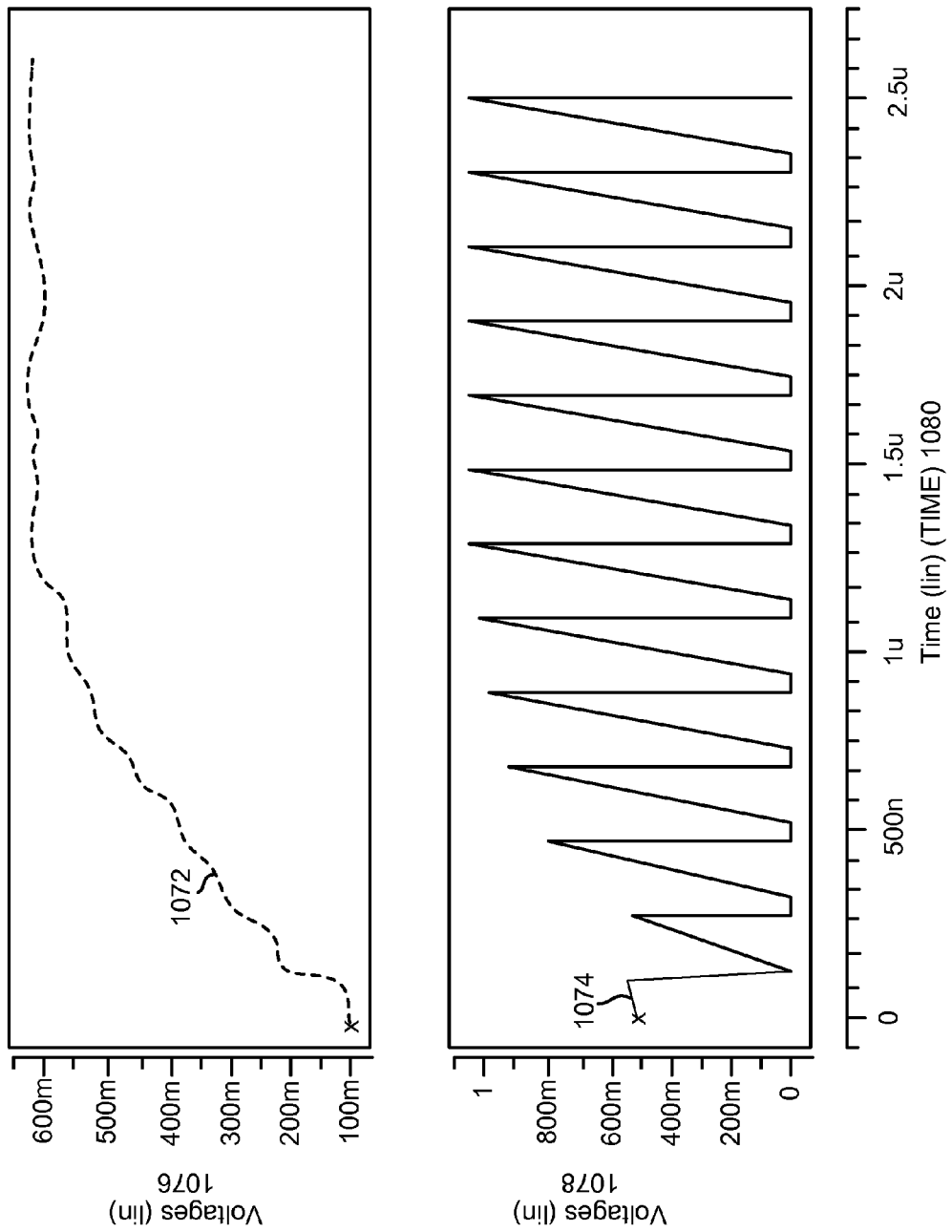
FIG. 12 is a graph illustrating the stabilization of a ramp generator with feedback.

FIG. 12 is a graph illustrating the stabilization of a ramp generator with feedback. The output voltage 1076 of the ramp generator $V_{ramp}$ 1072 is shown over time 1080. The time 1080 scale of FIG. 12 shows microsecond values (e.g., 1u=1 microsecond). $V_{ramp}$ 1072 may increase to $V_{max}$ (approximately 600 millivolts in the example of FIG. 10) over a period of time. For example, $V_{ramp}$ 1072 may approach $V_{max}$ after 6-7 cycles. $V_{ramp}$ 1072 may approach linearity while maintaining the proper slope. The output voltage 1078 of the feedback circuit 216 feedback voltage node 1074 is also shown over time 1080. The feedback voltage node 1074 may switch between 0 volts and VDD (approximately one volt in the example of FIG. 12) to maintain the linearity and proper slope of $V_{ramp}$ 1072.

FIGS. 13a-13f are graphs illustrating the analog and digital waveforms of a time-to-voltage converter 218 over time. FIG. 13a illustrates the analog time-to-voltage converter 218 output 1301, which may also be referred to as the jitter voltage signal 242. FIG. 13b illustrates a jitter waveform 1303 converted to a rail-to-rail signal. This preconditioning is done in the time-to-voltage converter module before this analog representation may be fed to the ADC. FIG. 13c illustrates the actual jitter waveform 1305 output by the time-to-voltage converter 218. FIGS. 13d-f illustrate the ADC 233 outputs 1307, 1309, 1311 representing per cycle jitter.

If the input signal is measured and processed for a large time interval, the calculated jitter samples may have a Gaussian distribution. When data is collected sequentially and processed without any sorting, the random nature of the data is preserved. The Gaussian nature of the jitter samples collected and the statistical parameters may remain constant if a subset of data is obtained by undersampling the parent dataset. A large sample size and random nature of recorded data may be required for validity of the above assumption. This may be verified in simulation by generating a string of 1 million data points of Gaussian-random nature in Matlab which is then sampled at $R_{data}/100$ and the graphical representation as well as the statistical parameters may be compared.

The time-to-voltage converter module 218 may be capable of handling high data rates for jitter waveform generation. Simulations for frequencies up to 1 gigahertz (GHz) have been run by changing the current bias and load capacitor values. On-chip SoC/SiP modules may be unable to operate at such high speeds and a compromise can be reached where the ADC 233 is clocked at a frequency which is 1/n times the data rate where n is an integer. Though this results in an increase in test time as more signal cycles need to be captured, it does not result in any data distortion or data loss artifacts as seen in the Gaussian-random distribution statistics.

The jitter measurement BiST scheme may be tested with an ideal clock signal injected with a linearly varying jitter. The time period $T_{per}$ of the input signal varies linearly between $T_{per}-\delta$ to $T_{per}+\delta$, and vice versa, repeatedly. Waveforms captured for four such cycles are represented in FIG. 13 with a 3-bit on-board ADC 233. The time-to-voltage output ramp is modulated by the input signal jitter, as can be seen in FIG. 13a. The variation in input signal period provides different charging durations for the load capacitor. The ADC reference voltages are provided by $V_{ref}$ values obtained from SPICE simulations for all three process corners.

The circuit is also characterized for various input frequencies and corresponding percentage jitter signals added. A SoC/SiP may have either multiple PLL's or a single programmable PLL operating at multiple frequencies that need to be characterized; having the ability to perform accurate jitter measurements for multiple frequencies may be important for the BiST scheme. Gate widths in the current source in the time-to-voltage converter 218 as well as the load capacitance used for converting period variations into a voltage signal greatly affect the bandwidth of the input signal that can be accurately measured for jitter.

If the current source and load capacitance are designed for a frequency $F_{nom}$, the feedback network 216 may need to adjust the value of the current through the charging circuit to maintain a constant ramp slope at the end of the calibration period. For a frequency $F_{nom}-\delta$, where $\delta$ is a very large number, the feedback voltage 234 may need to trim the current excessively and can drive the gating transistor into cut-off, disabling the current charging process. Similarly, it may not be possible to limit the current to maintain the constant slope for a frequency $F_{nom}-\delta$ if the transistor is saturated before the feedback circuit negative correction can be applied.

FIGS. 14a-14b are graphs illustrating injected jitter and output jitter. The measurements of jitter may be performed at 10 MHz. In FIG. 14a, a voltage representation is shown of injected jitter 1401. In FIG. 14b, a voltage representation of the measured output jitter voltage signal 1403 over multiple cycles is shown.

Histogram methods are commonly used in production jitter testing where jitter timing variation on a predetermined number of signal cycles is measured and analyzed. Various criteria may be applied in order to screen out potentially problematic parts—some of the jitter test methods have absolute limits defined where any jitter measurement exceeding the limit value results in rejection of the part. Outlier screening methods may also be utilized where, apart from the absolute limit, a percentage limit is defined dynamically from the measured values and any measurement which falls outside a 6σ results in rejection of the part. The outlier method is more commonly used in communication circuits as any data loop has a tolerance limit specified in terms of Bit Error Rate (BER) which can be reliably defined by using outlier methods of jitter measurement and sorting. The BiST jitter measurement scheme is compatible with outlier analysis as it captures an array of jitter voltage measurements on successive cycles and this data can be analyzed using the computing resources of the ATE without any significant overheads.

Figure 15:
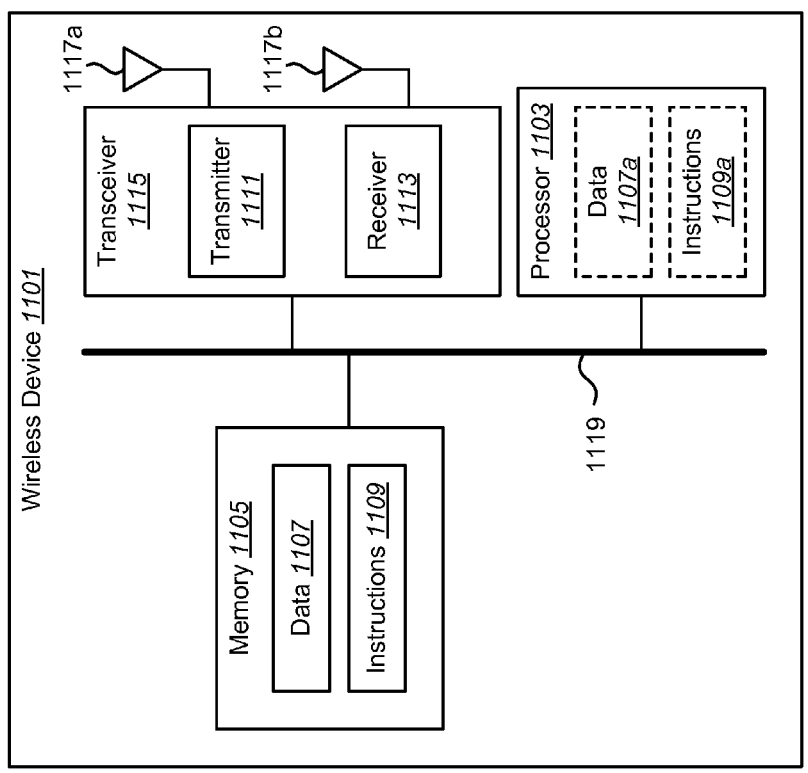
FIG. 15 is a block diagram illustrating certain components that may be included within a wireless device that is configured in accordance with the present disclosure.

FIG. 15 illustrates certain components that may be included within a wireless device 1101. The wireless device 1101 may be a mobile device/station or a base station. Examples of mobile stations include cellular phones, hand-held wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc. The present systems and methods may be used on an integrated circuit 106 that may be part of a wireless device 1101. Additionally, the present systems and methods may be used on an integrated circuit 106 that may be an electronic device that is not a wireless device 1101. However, the electronic device block diagram and components would be similar to the wireless device 1101 of FIG. 15 except that the electronic device may not have a transceiver 1115.

The wireless device 1101 includes a processor 1103. The processor 1103 may be a general purpose single- or multi-chip microprocessor (e.g., an ARM), a special purpose microprocessor (e.g., a digital signal processor (DSP)), a microcontroller, a programmable gate array, etc. The processor 1103 may be referred to as a central processing unit (CPU). Although just a single processor 1103 is shown in the wireless device 1101 of FIG. 15, in an alternative configuration, a combination of processors (e.g., an ARM and DSP) could be used.

The wireless device 1101 also includes memory 1105. The memory 1105 may be any electronic component capable of storing electronic information. The memory 1105 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1107 and instructions 1109 may be stored in the memory 1105. The instructions 1109 may be executable by the processor 1103 to implement the methods disclosed herein. Executing the instructions 1109 may involve the use of the data 1107 that is stored in the memory 1105. When the processor 1103 executes the instructions 1107, various portions of the instructions 1109a may be loaded onto the processor 1103, and various pieces of data 1107a may be loaded onto the processor 1103.

The wireless device 1101 may also include a transmitter 1111 and a receiver 1113 to allow transmission and reception of signals to and from the wireless device 1101. The transmitter 1111 and receiver 1113 may be collectively referred to as a transceiver 1115. An antenna 1117 may be electrically coupled to the transceiver 1115. The wireless device 1101 may also include (not shown) multiple transmitters, multiple receivers, multiple transceivers and/or multiple antenna (e.g., 1117a, 1117b).

The various components of the wireless device 1101 may be coupled together by one or more buses, which may include a power bus, a control signal bus, a status signal bus, a data bus, etc. For the sake of clarity, the various buses are illustrated in FIG. 15 as a bus system 1119.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 5, 6 and 7, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An integrated circuit configured for built in self-test (BiST) jitter measurement, comprising:
    a time-to-voltage converter, wherein the time-to-voltage converter generates a voltage signal proportional to timing jitter present in a clock/data signal input for the built in self-test jitter measurement;
    feedback circuitry for the time-to-voltage converter, wherein the feedback circuitry provides a ramp slope for the time-to-voltage converter, and wherein the feedback circuitry adjusts a gate bias for a transistor in the time to voltage converter to provide a linearly increasing voltage ramp;
    a calibration controller, wherein the calibration controller provides control signals to the time-to-voltage converter for process-independent calibration as part of the built in self-test jitter measurement;
    and
    a sample-and-hold (S/H) circuit, wherein the S/H circuit provides a set bias voltage to the time-to-voltage converter once calibration is complete.

2. The integrated circuit of claim 1, wherein the feedback circuitry comprises a clocked comparator.

3. The integrated circuit of claim 2, wherein the clocked comparator outputs a supply voltage if the voltage ramp is less half the supply voltage at half the ramp period.

4. The integrated circuit of claim 2, wherein the clocked comparator outputs a voltage of zero volts if the voltage ramp is greater than half the supply voltage at half the ramp period.

5. The integrated circuit of claim 1, further comprising an on-chip analog-to-digital converter (ADC).

6. The integrated circuit of claim 5, wherein outputs from the ADC are provided to output pads for observation by automatic test equipment (ATE) using a simple functional pattern.

7. The integrated circuit of claim 1, wherein the time-to-voltage converter comprises a current source applied to a capacitor.

8. The integrated circuit of claim 1, further comprising a multiplexer, wherein the multiplexer may switch an input for the time-to-voltage converter between the feedback circuitry and the S/H circuit.

9. A method for built in self-test (BiST) jitter measurement using an integrated circuit configured for built in self-test (BiST) jitter measurement, comprising:
    generating a constant current;
    providing a jitter voltage signal from a time-to-voltage converter in the integrated circuit, wherein the jitter voltage signal is a voltage representation of jitter in a clock/data signal input for the built in self-test jitter measurement;
    providing feedback to the time-to-voltage converter, wherein feedback circuitry provides a ramp slope for the time-to-voltage converter, and wherein the feedback circuitry adjusts a gate bias for a transistor in the time to voltage converter to provide a linearly increasing voltage ramp;
    providing the jitter voltage signal to automatic testing equipment (ATE); and
    performing jitter measurements using the ATE.

10. The method of claim 9, wherein the feedback circuitry provides calibration of the time-to-voltage converter.

11. The method of claim 10, further comprising switching an input for the time-to-voltage converter between the feedback circuitry and a sample-and-hold (S/H) circuit.

12. The method of claim 10, wherein the ATE is analog ATE.

13. The method of claim 9, wherein the time-to-voltage generator comprises a current source applied to a capacitor.

14. The method of claim 9, further comprising applying the jitter voltage signal to an on-chip analog-to-digital converter (ADC).

15. The method of claim 14, further comprising providing outputs from the ADC to output pads for observation by digital ATE.

16. The method of claim 14, wherein the ADC, the time-to-voltage converter and feedback circuitry providing feedback are configured to use phase-shifted limited duty cycle clocks.

17. The method of claim 9, wherein the feedback circuitry comprises a clocked comparator.

18. The method of claim 17, wherein the clocked comparator outputs a supply voltage if the voltage ramp is less than half the supply voltage at half the ramp period.

19. The method of claim 17, wherein the clocked comparator outputs a voltage of zero volts if the voltage ramp is greater than half the supply voltage at half the ramp period.

20. A wireless device configured for built in self-test (BiST) jitter measurement, comprising:
    a processor;
    memory in electronic communication with the processor;
    a transceiver; and
    an integrated circuit configured for built-in self-test jitter measurement, including:
    a time-to-voltage converter, wherein the time-to-voltage converter generates a voltage signal proportional to timing jitter present in a clock/data signal input for the built in self-test jitter measurement;
    feedback circuitry for the time-to-voltage converter, wherein the feedback circuitry provides a ramp slope for the time-to-voltage converter, and wherein the feedback circuitry adjusts a gate bias for a transistor in the time to voltage converter to provide a linearly increasing voltage ramp;
    a calibration controller, wherein the calibration controller provides control signals to the time-to-voltage converter for process-independent calibration; and
    a sample-and-hold (S/H) circuit, wherein the S/H circuit provides a set bias voltage to the time-to-voltage converter once calibration is complete.

21. The wireless device of claim 20, wherein the feedback circuitry comprises a clocked comparator.

22. The wireless device of claim 21, wherein the clocked comparator outputs a supply voltage if the voltage ramp is less than half the supply voltage at half the ramp period.

23. The wireless device of claim 21, wherein the clocked comparator outputs a voltage of zero volts if the voltage ramp is greater than half the supply voltage at half the ramp period.

24. The wireless device of claim 20, further comprising an on-chip analog-to-digital converter (ADC).

25. The wireless device of claim 24, wherein outputs from the ADC are provided to output pads for observation by automatic test equipment (ATE) using a simple functional pattern.

26. The wireless device of claim 20, wherein the time-to-voltage converter comprises a current source applied to a capacitor.

27. The wireless device of claim 20, further comprising a multiplexer, wherein the multiplexer may switch an input for the time-to-voltage converter between the feedback circuitry and the S/H circuit.

28. An apparatus for built in self-test (BiST) jitter measurement, comprising:
   means for generating a constant current;
   means for providing a jitter voltage signal by a time-to-voltage converter, wherein the jitter voltage signal is a voltage representation of jitter in a clock/data signal input for the built in self-test litter measurement;
   means for providing feedback to the time-to-voltage converter, wherein the means for providing feedback provides a ramp slope for the time-to-voltage converter, and wherein the means for providing feedback adjusts a gate bias for a transistor in the time to voltage converter to provide a linearly increasing voltage ramp;
   means for providing the jitter voltage signal to automatic testing equipment (ATE); and
   means for performing jitter measurements using the ATE.

29. A computer-program product for a wireless device configured for built in self-test (BiST) jitter measurement, the computer-program product comprising a non-transitory computer-readable medium having instructions thereon, the instructions comprising:
   code for generating a constant current; code for providing a jitter voltage signal by a time-to-voltage converter, wherein the jitter voltage signal is a voltage representation of jitter in a clock/data signal input for the built in self-test jitter measurement;
   code for providing feedback to the time-to-voltage converter, wherein the feedback provides a ramp slope for the time-to-voltage converter, and wherein the feedback adjusts a gate bias for a transistor in the time to voltage converter to provide a linearly increasing voltage ramp;
   code for providing the jitter voltage signal to automatic testing equipment (ATE); and
   code for performing built in self-test jitter measurements using the ATE.

\* \* \* \* \*